(12) United States Patent
Yoshikawa et al.

(10) Patent No.: US 7,736,824 B2
(45) Date of Patent: Jun. 15, 2010

(54) PHOTOMASK BLANK, PHOTOMASK, AND METHOD OF MANUFACTURE

(75) Inventors: Hiroki Yoshikawa, Niigata-ken (JP); Yukio Inazuki, Niigata-ken (JP); Noriyasu Fukushima, Niigata-ken (JP); Hideo Kaneko, Niigata-ken (JP); Satoshi Okazaki, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 174 days.

(21) Appl. No.: 11/952,283

(22) Filed: Dec. 7, 2007

(65) Prior Publication Data

US 2008/0090159 A1 Apr. 17, 2008

Related U.S. Application Data

(62) Division of application No. 10/811,924, filed on Mar. 30, 2004, now Pat. No. 7,329,474.

(30) Foreign Application Priority Data

| Mar. 31, 2003 | (JP) | ............................. 2003-093712 |
| Mar. 31, 2003 | (JP) | ............................. 2003-093936 |
| Mar. 31, 2003 | (JP) | ............................. 2003-094321 |

(51) Int. Cl.
*G03F 1/00* (2006.01)
*B32B 17/10* (2006.01)

(52) U.S. Cl. .......................................... 430/5; 428/430

(58) Field of Classification Search ............... 430/5, 430/394; 378/35; 204/192.1, 192.11, 192.12; 428/428, 430

See application file for complete search history.

(56) References Cited

U.S. PATENT DOCUMENTS

| 5,130,401 A | 7/1992 | Arai et al. |
| 5,474,864 A | 12/1995 | Isao et al. |

(Continued)

FOREIGN PATENT DOCUMENTS

EP 0-540-040 A1 5/1993

(Continued)

*Primary Examiner*—Stephen Rosasco
(74) *Attorney, Agent, or Firm*—Birch, Stewart, Kolasch & Birch, LLP

(57) ABSTRACT

A photomask blank comprising a multilayer film including at least four layers of different compositions, wherein the interface between the layers is moderately graded in composition; a phase shift mask blank comprising a phase shift film of at least two layers including a surface layer of a composition based on a zirconium silicide compound and a substrate adjacent layer of a composition based on a molybdenum silicide compound, and a further layer between one layer and another layer of a different composition, the further layer having a composition moderately graded from that of the one layer to that of the other layer; a phase shift mask blank comprising a phase shift film including a plurality of layers containing a metal and silicon in different compositional ratios which are stacked in such order that a layer having a higher etching rate is on the substrate side and a layer having a lower etching rate is on the surface side. The invention provides a photomask blank, typically a phase shift mask blank, which satisfies optical properties such as transmittance, reflectance and refractive index at an exposure wavelength of interest, and has an etched pattern with a minimal line edge roughness, and a photomask, typically a phase shift mask obtained therefrom.

11 Claims, 9 Drawing Sheets

U.S. PATENT DOCUMENTS

| | | |
|---|---|---|
| 5,605,776 A | 2/1997 | Isao et al. |
| 5,629,114 A | 5/1997 | Isao et al. |
| 5,674,647 A | 10/1997 | Isao et al. |
| 5,691,090 A | 11/1997 | Isao et al. |
| 5,830,607 A | 11/1998 | Isao et al. |
| 6,037,083 A * | 3/2000 | Mitsui ............................ 430/5 |
| 6,458,496 B2 | 10/2002 | Motonaga et al. |
| 6,544,696 B2 | 4/2003 | Westerman et al. |
| 6,682,860 B2 | 1/2004 | Angelopoulos et al. |
| 6,899,979 B1 | 5/2005 | Mitsui et al. |
| 7,037,625 B2 | 5/2006 | Kaneko et al. |
| 7,217,481 B2 | 5/2007 | Mitsui et al. |
| 2002/0025478 A1 * | 2/2002 | Inazuki et al. .................. 430/5 |

FOREIGN PATENT DOCUMENTS

| | | |
|---|---|---|
| EP | 1-104-787 A2 | 6/2001 |
| EP | 1-302-512 A2 | 4/2003 |
| JP | 7-140635 A | 6/1995 |
| JP | 7-230716 A | 8/1995 |
| JP | 7-253655 A | 10/1995 |
| JP | 8-137094 A | 5/1996 |
| JP | 8-262688 A | 10/1996 |
| JP | 2002-23342 A | 1/2002 |
| JP | 2002-72443 A | 3/2002 |
| JP | 2002-229182 A | 8/2002 |
| JP | 2002-244274 A | 8/2002 |
| JP | 2003-5347 A | 1/2003 |
| WO | WO-00/07072 A1 | 2/2000 |

* cited by examiner

DEPOSITION DIRECTION

PHOTOMASK BLANK, PHOTOMASK, AND METHOD OF MANUFACTURE

CROSS REFERENCE PARAGRAPH

This application is a Divisional of application Ser. No. 10/811,924, filed on Mar. 30, 2004, now U.S. Pat. No. 7,329,474 the entire contents of which are hereby incorporated by reference and for which priority is claimed under 35 U.S.C. §120. This application also claims priority to JP 2003-093712, JP 2003-093936 and JP 2003-094321 filed in Japan on Mar. 31, 2003. The entire contents of which are hereby incorporated by reference and for which priority is claimed under 35 U.S.C. §119.

BACKGROUND OF THE INVENTION

1. Field of the Invention

The present invention relates to photomask blanks and photomasks for use in the microfabrication of semiconductor integrated circuits or the like, and methods of manufacturing the same. It also relates to phase shift mask blanks, phase shift masks, and methods of manufacturing the same. More particularly, it relates to halftone phase shift mask blanks and phase shift masks which can attenuate the intensity of exposure wavelength light with a phase shift film, and methods of manufacturing the same.

2. Prior Art

Photomasks are used in a broad range of applications, including the manufacture of semiconductor integrated circuit (IC), large-scale integration (LSI) and VLSI chips. They are basically constructed by starting with a photomask blank comprising a transparent substrate and a light-shielding film made primarily of chromium thereon and processing the light-shielding film by photolithography using UV radiation or electron beams for thereby forming a desired pattern in the film. The market demand for ever higher levels of integration in semiconductor integrated circuits has led to a rapid reduction in the minimum feature size of photomask patterns. Such miniaturization has been achieved in part by the use of shorter wavelength exposure light. Although exposure using shorter wavelength light does improve resolution, it has undesirable effects, such as reducing the focal depth, lowering process stability and adversely impacting product yield.

One pattern transfer technique that has been effective for resolving such problems is phase shifting. This involves the use of a phase shift mask as the mask for transferring microscopic circuit patterns.

As shown in accompanying FIGS. 10A and 10B, a phase shift mask (typically, halftone phase shift mask) is generally composed of a substrate on which a phase shift film has been patterned. The mask has both exposed substrate areas (first light-transmitting areas) "a" on which there is no phase shift film, and phase shifters (second light-transmitting areas) "b" that form a pattern region on the mask. The phase shift mask improves the contrast of a transferred image by providing, as shown in FIG. 10B, a phase difference of 180 degrees between light passing through the pattern region and light passing through the non-pattern region, and utilizing the destructive interference of light at the boundary regions of the pattern to set the light intensity in the areas of interference to zero. The use of phase shifting also makes it possible to increase the focal depth at the necessary resolution. Hence, compared with a conventional mask having an ordinary light-shielding pattern such as chromium film, the phase shift mask can improve resolution and increase the margin of the exposure process.

For practical purposes, such phase shift masks can be broadly categorized, according to the light-transmitting characteristics of the phase shifter, as either completely transmitting phase shift masks or halftone phase shift masks. Completely transmitting phase shift masks are masks in which the phase shifter has the same light transmittance as the substrate, and which are thus transparent to light at the exposure wavelength. In halftone phase shift masks, the phase shifter has a light transmittance that ranges from about several percent to several tens of percent the transmittance of exposed substrate areas.

FIG. 1 shows the basic structure of a halftone phase shift mask blank, and FIG. 2 shows the basic structure of a halftone phase shift mask. The halftone phase shift mask blank shown in FIG. 1 includes a transparent substrate 1 and a halftone phase shift film 2 formed over the substantially entire surface of the substrate 1. The halftone phase shift mask shown in FIG. 2 is arrived at by patterning the phase shift film 2 of the blank and includes phase shifters 2a which form the pattern regions of the mask and exposed substrate areas 1a on which there is no phase shift film. Exposure light that has passed through the phase shifter 2a phase-shifted relative to exposure light that has passed through the exposed substrate area 1a. The transmittance of the phase shifter 2a is selected such that exposure light which has passed through the phase shifter 2a has too low an intensity to sensitize the resist on the substrate to which the pattern is being transferred. Accordingly, the phase shifter 2a functions to substantially shield out the exposure light.

Halftone phase shift masks of the above type encompass halftone phase shift masks of the single-layer type which are simple in structure and easy to manufacture. Single-layer halftone phase shift masks known to the art include those described in JP-A 7-140635 which have a phase shifting film composed of a molybdenum silicide material such as MoSiO or MoSiON.

These phase shift masks are manufactured from phase shift mask blanks. It is important for the phase shift mask blanks to exhibit a distinct etched cross-sectional geometry and low defectiveness during mask pattern formation while satisfying optical properties such as transmittance, reflectance and refractive index to the exposure wavelength of interest.

Phase shift films in such phase shift mask blanks are generally deposited by sputtering. For the deposition, a metal silicide target is typically used which is prepared by mixing a metal and silicon in such a compositional ratio that a desired transmittance is obtainable after deposition, and sintering the mixture. The phase shift film thus deposited has a constant compositional ratio of silicon to metal in a depth direction of the film.

In the aforementioned single-layer halftone phase shift mask, however, the adjustment of optical properties to desired values dictates a certain film composition. It is then difficult to produce a phase shift film that can satisfy other desired properties as well.

To avoid this problem, a phase shift multilayer film has been proposed comprising a plurality of layers including a layer satisfying optical properties and a layer satisfying other properties such as chemical resistance. However, the phase shift film comprising a plurality of layers has a problem of exacerbated line edge roughness because steps are frequently formed in sidewalls of an etched pattern during pattern formation.

Aside from the phase shift films mentioned above, a similar problem arises where a plurality of layers having different compositions are stacked to provide one function, for example, in the case of a reflection type photomask having a reflective film formed by stacking alternate layers of different compositions.

Particularly when a phase shift mask is manufactured from a phase shift mask blank, the phase shift film is typically patterned by reactive ion etching (RIE). When a layer having a constant composition of elements in a depth direction thereof is subjected to RIE, etching proceeds not only in a vertical direction toward the substrate, but also in a lateral direction. Then at the end of etching, the boundary between the etched-away portion and the retained phase shift film portion is inclined in cross section. When exposure is made through a mask having an inclined boundary geometry, the contrast of the mask pattern at the boundary becomes blurred. Only a low contrast is provided upon exposure of a very fine pattern.

SUMMARY OF THE INVENTION

An object of the invention is to provide a photomask blank, typically a phase shift mask blank, which affords a photomask that satisfies optical properties such as transmittance, reflectance and refractive index at an exposure wavelength of interest, and has an etched pattern with a minimal line edge roughness, that is, a photomask having an improved etched cross-sectional geometry upon mask pattern formation; a photomask, typically a phase shift mask obtained therefrom; and methods of manufacturing the photomask blank and the photomask. A further object is to provide a phase shift mask blank which exhibits good perpendicularity in etched cross-sectional geometry upon mask pattern formation by reactive ion etching (RIE); a phase shift mask obtained therefrom; and methods of manufacturing the phase shift mask blank and the phase shift mask.

In one aspect, the invention pertains to a photomask blank comprising a substrate and a multilayer film thereon including at least four layers whose composition is different between adjacent layers. We have found that a photomask blank and a photomask using the same in which a mask pattern having a minimal line edge roughness can be formed are obtained when the interface of each layer with an adjacent layer is moderately graded in composition.

In another aspect, the invention pertains to a phase shift mask blank comprising a transparent substrate and a phase shift film of at least two layers thereon. We have found that a phase shift mask blank and a phase shift mask using the same which have an improved etched cross-sectional geometry upon mask pattern formation while satisfying optical properties are obtained when the phase shift film includes a surface layer of a composition based on a zirconium silicide compound, a substrate adjacent layer of a composition based on a molybdenum silicide compound, and at least one layer of a moderately graded composition therebetween.

We found that a combination of a zirconium silicide compound coating with a molybdenum silicide compound coating is effective as a layered configuration having good chemical resistance and minimized steps in etched cross-section. However, a restrictive compositional range of zirconium silicide compound coating and molybdenum silicide compound coating is required to eliminates steps in etched cross-section. That is, the ratio [Zr]/[Mo] of zirconium concentration [Zr] to molybdenum concentration [Mo] must fall in the range between 0.7 and 1.3. This limits the freedom of design in positively improving the cross-sectional geometry of an etched pattern (the inclination angle of sidewall). It is desired to solve this problem.

We have discovered that when the compositions of zirconium silicide compound coating and molybdenum silicide compound coating are continuously varied, a phase shift film is obtained which develops no steps in etched cross-section, and has improved chemical resistance and an optimum etched cross-sectional geometry, especially an optimum inclination angle.

In a further aspect, the invention pertains to a phase shift mask blank comprising a substrate which is transparent to exposure light and a phase shift film thereon. We have discovered that when the phase shift film includes a plurality of layers containing a metal and silicon in different compositional ratios and the layers are stacked in such order that a layer having a higher etching rate is on the substrate side and a layer having a lower etching rate is on the surface side, a phase shift mask blank which exhibits good perpendicularity in etched cross-sectional geometry upon mask pattern formation by etching, especially reactive ion etching (RIE) is obtained; that a phase shift mask using the same has improved perpendicularity in etched cross-sectional geometry.

We have further discovered that the phase shift mask blank is manufactured by using a sputtering system capable of simultaneously causing at least two targets to produce electric discharges, and sputtering a combination of at least two metal silicide targets, or a combination of at least one metal silicide target with a metal target or a silicon target or both, thereby depositing layers on a substrate which is transparent to exposure light, until a phase shift film is formed.

In a first embodiment, the present invention provides a photomask blank, a photomask, and a method of manufacturing a photomask blank, as set forth below.

[1] A photomask blank comprising a substrate and a multilayer film thereon including at least four layers of different compositions, wherein the interface between the layers is moderately graded in composition.

[2] The photomask blank of [1] wherein said multilayer film includes layers composed mainly of compounds of metal silicide with oxygen and/or nitrogen.

[3] The photomask blank of [1] or [2] wherein said multilayer film includes at least one layer composed mainly of molybdenum silicide oxynitride.

[4] The photomask blank of [1] to [3] wherein said multilayer film is a phase shift film, said blank further comprising a chromium base light-shielding film or a chromium base antireflection film or a laminate film having stacked at least one chromium base light-shielding film and at least one chromium base antireflection film, formed on said multilayer film.

[5] A method for manufacturing the photomask blank of any one of [1] to [4], comprising sputter-depositing layers on the substrate using a sputtering deposition system equipped with a plurality of targets of different compositions, across which electric powers are applied for sputtering, and gradually changing a combination of sputtering powers across the targets in proximity to the interface between layers, thereby depositing a plurality of layers of different compositions.

[6] The method of [5] wherein the plurality of targets comprise a metal silicide target and a silicon target.

[7] The method of [5] wherein the plurality of targets comprise a metal target and a silicon target.

[8] The method of [5] to [7] wherein the step of gradually changing a combination of sputtering powers across the targets in proximity to the interface between layers continues for a power grading time period which is at least 10% of a time period required to complete deposition of each layer.

[9] A photomask fabricated by patterning the multilayer film of the photomask blank of any one of [1] to [4].

In the first embodiment of the invention, a photomask blank of configuration having stacked a plurality of layers of different compositions can minimize the line edge roughness incurred when a mask pattern is formed in the multilayer film by etching.

More particularly, in a photomask blank comprising a multilayer film including at least four layers of different compositions on a substrate, the interface of each layer with an adjacent layer is moderately graded in composition. This ensures that when the multilayer film is patterned to fabricate a photomask, the line edge roughness of the mask pattern is minimized.

Particularly when a phase shift film is formed by the multilayer film, and a chromium base light-shielding film or a chromium base antireflection film or a laminate film having stacked at least one layer of each of these films is formed on the phase shift film, these films cooperate to enable more precise patterning, fully complying with further miniaturization and integration of semiconductor integrated circuits.

In a second embodiment, the present invention provides a phase shift mask blank, a phase shift mask, and a method of manufacturing a phase shift mask blank, as set forth below.

[10] A phase shift mask blank comprising a transparent substrate and a phase shift film of at least two layers thereon, said phase shift film having a composition based on a zirconium silicide compound on a surface side and a composition based on a molybdenum silicide compound on a substrate side, said phase shift film including a first layer, a second adjacent layer of a different composition, and a third layer disposed between the first and second layers and having a composition moderately graded from the composition of the first layer to the composition of the second layer.

[11] The phase shift mask blank of [10] wherein an intermediate layer is disposed between a surface layer of a composition based on a zirconium silicide compound and a substrate-adjacent layer of a composition based on a molybdenum silicide compound, said intermediate layer having a composition moderately graded from the composition of the surface layer to the composition of the substrate-adjacent layer.

[12] The phase shift mask blank of [10] or [11] wherein a surface layer of a composition based on a zirconium silicide compound is a coating composed mainly of a compound of zirconium silicide with oxygen and/or nitrogen and a substrate-adjacent layer of a composition based on a molybdenum silicide compound is a coating composed mainly of a compound of molybdenum silicide with oxygen and/or nitrogen.

[13] The phase shift mask blank of [10] to [12], further comprising a chromium base light-shielding film or a chromium base antireflection film or a laminate film having stacked at least one chromium base light-shielding film and at least one chromium base antireflection film, formed on said phase shift film.

[14] A method for manufacturing the phase shift mask blank of any one of [10] to [13], comprising sputter-depositing layers on the substrate by using a sputtering deposition system comprising a molybdenum silicide target, a zirconium silicide target and optionally a silicon target in a chamber, feeding a sputtering gas containing at least oxygen and/or nitrogen, and applying electric powers across the targets for sputtering, and changing a combination of sputtering powers across the targets, thereby forming the phase shift film having a graded composition.

[15] A phase shift mask fabricated by patterning the phase shift film of the phase shift mask blank of any one of [10] to [13].

In the second embodiment, the above-described construction enables to manufacture a phase shift mask which is improved in etched cross-sectional geometry upon mask pattern formation.

More particularly, a phase shift mask blank comprising a phase shift film of at least two layers on a transparent substrate, and a phase shift mask obtained therefrom, satisfy optical properties and are improved in etched cross-sectional geometry upon mask pattern formation when the phase shift film includes a surface layer of a composition based on a zirconium silicide compound, a substrate adjacent layer of a composition based on a molybdenum silicide compound, and at least one layer of a moderately graded composition disposed therebetween.

Particularly when a chromium base light-shielding film or a chromium base antireflection film or a laminate film having stacked at least one layer of each of these films is formed on the phase shift film, these films cooperate to enable more precise patterning, fully complying with further miniaturization and integration of semiconductor integrated circuits.

In a third embodiment, the present invention provides a phase shift mask blank, a phase shift mask, and methods of manufacturing the same, as set forth below.

[16] A phase shift mask blank comprising a substrate which is transparent to exposure light and a phase shift film thereon, said phase shift film having one side contacting the substrate and a surface side remote therefrom, said phase shift film comprising a plurality of layers containing a metal and silicon in different compositional ratios which are stacked in such order that a layer having a higher etching rate is on the substrate side and a layer having a lower etching rate is on the surface side.

[17] The phase shift mask blank of [16] wherein said phase shift film comprises one of metal silicide oxide, metal silicide nitride, metal silicide oxynitride, metal silicide oxycarbide, metal silicide nitride carbide and metal silicide oxide nitride carbide.

[18] The phase shift mask blank of [16] or [17] wherein said metal is molybdenum.

[19] The phase shift mask blank of [18] wherein in said phase shift film, the plurality of layers are stacked such that the compositional ratio of silicon to molybdenum increases from the substrate side to the surface side.

[20] The phase shift mask blank of [16] to [19] wherein a phase difference distribution in a substrate plane at the wavelength of light used for exposure has a center value of 180±10 degrees, and a transmittance distribution in a substrate plane has a center value of 3 to 40%.

[21] The phase shift mask blank of [20] wherein the phase difference distribution in a substrate plane at the wavelength of light used for exposure is within ±2.0 degrees relative to its center value, and the transmittance distribution in a substrate plane is within ±0.15% relative to its center value.

[22] A method for manufacturing the phase shift mask blank of [16], comprising using a sputtering system capable of simultaneously causing at least two targets to produce electric discharges, and sputtering a combination of at least two metal silicide targets, or a combination of at least one metal silicide target with a metal target or a silicon target or both, thereby depositing layers on the substrate to form the phase shift film.

[23] The method of [22] wherein the sputtering is reactive sputtering using a reactive gas, and said phase shift film comprises one of metal silicide oxide, metal silicide nitride, metal silicide oxynitride, metal silicide oxycarbide, metal silicide nitride carbide and metal silicide oxide nitride carbide.

[24] The method of [22] or [23] wherein said metal is molybdenum.

[25] The method of [24] wherein in said phase shift film, the plurality of layers are stacked such that the compositional ratio of silicon to molybdenum increases from the substrate side to the surface side.

[26] A phase shift mask fabricated by patterning the phase shift film of the phase shift mask blank of any one of [16] to [21].

[27] A method for manufacturing a phase shift mask, comprising the steps of forming a resist film pattern on the phase shift film of the phase shift mask blank of any one of [16] to [21] by lithography; etching away those portions of the phase shift film which are not covered with the resist film; and removing the resist film.

In the third embodiment, a phase shift mask blank exhibits good perpendicularity in etched cross-sectional geometry upon mask pattern formation by etching, especially reactive ion etching (RIE). This enables more precise patterning, fully complying with further miniaturization and integration of semiconductor integrated circuits.

More particularly, the third embodiment pertains to a phase shift mask blank comprising a phase shift film on a substrate which is transparent to exposure light. When the phase shift film includes a plurality of layers containing a metal and silicon in different compositional ratios and the layers are stacked in such order that a layer having a higher etching rate is on the substrate side and a layer having a lower etching rate is on the surface side as viewed from the substrate side to the surface side of the phase shift film, the phase shift mask blank exhibits good perpendicularity in etched cross-sectional geometry upon mask pattern formation by etching, especially reactive ion etching (RIE). A phase shift mask using the same has improved perpendicularity in etched cross-sectional geometry. This enables more precise patterning, fully complying with further miniaturization and integration of semiconductor integrated circuits.

DESCRIPTION OF THE PREFERRED EMBODIMENTS

First Embodiment

The first embodiment of the invention pertains to a photomask blank comprising a multilayer film of at least four layers formed on a substrate. The substrate may be a substrate which is transmissive to exposure light such as quartz and $CaF_2$ or a high flatness substrate having a coefficient of thermal expansion of up to 1 ppm/° C.

Figure 1:
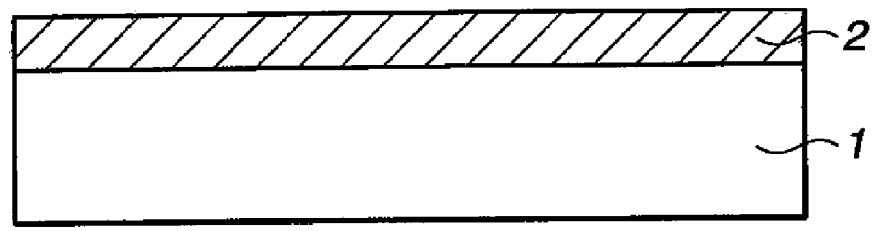
FIG. 1 is a cross-sectional view of a phase shift mask blank according to the first and second embodiments of the invention.
Figure 2:
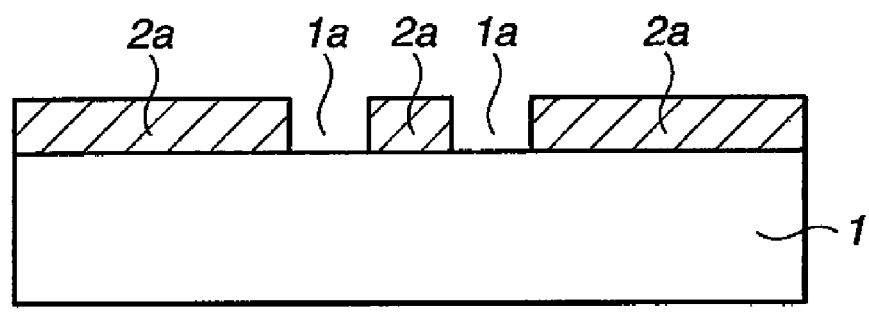
FIG. 2 is a cross-sectional view of a phase shift mask according to the first and second embodiments of the invention.

The multilayer film may be either a phase shift film or a film having an optical function such as a reflective film or semi-transmissive film. In an embodiment wherein the multilayer film is a phase shift film, as shown in FIG. 1, a phase shift film (in this embodiment, a phase shift multilayer film) 2 composed of metal silicide compounds is deposited on a substrate 1. A phase shift mask is obtained by patterning the phase shift film of the phase shift mask blank. The phase shift mask has patterned phase shifters 2 as shown in FIG. 2, wherein first light-transmitting areas (exposed substrate areas) 1a are defined between the patterned phase shifters and second light-transmitting areas 2a are provided by the patterned phase shifters.

The preferred phase shift mask blank has formed on a transparent substrate a phase shift film which is deposited by a reactive sputtering process using a sputtering gas containing an oxygen source gas and/or nitrogen source gas and formed of an oxide, nitride or oxynitride of metal silicide, has a transmittance to exposure light of several percents to several tens of percents, specifically about 3 to about 40%, and provides a phase difference of 180±5 degrees between light passing through the phase shifter and light passing through only the transparent substrate.

Molybdenum silicide is desirable as a metal silicide target because a dense, highly pure target is obtainable. Desirably, the phase shift film includes at least one layer composed mainly of a molybdenum silicide compound, especially molybdenum silicide oxynitride. Also desirable is a film having alternately stacked layers of oxide, nitride or oxynitride of molybdenum silicide and layers of oxide, nitride or oxynitride of silicon. In the event the multilayer film of the first embodiment is used as a laminate film for reflective film or the like, it is desirable to configure such that layers having different compositions of Si and Mo are stacked in order.

In the first embodiment, the multilayer film includes at least four layers. With less than four layers, line edge roughness cannot be fully reduced even if the composition and/or compositional ratio at the layer interface is graded. The upper limit on the number of layers may be selected as appropriate and is usually up to 200 layers, especially up to 100 layers, though not critical.

In the first embodiment, the respective layers have different compositions and the interface between the layers is moderately graded in composition. The term "different compositions" encompasses a situation in which layers are composed of different constituent elements and a situation in which layers are composed of the same constituent elements in different compositional ratios. The term "moderately graded composition" between two adjacent layers means that there may be either a continuous or stepwise transition from the composition of one layer to the composition of the other layer. In the latter case, the interface may have at least 5 steps, especially 10 to 50 steps of compositional transition.

Figure 12:
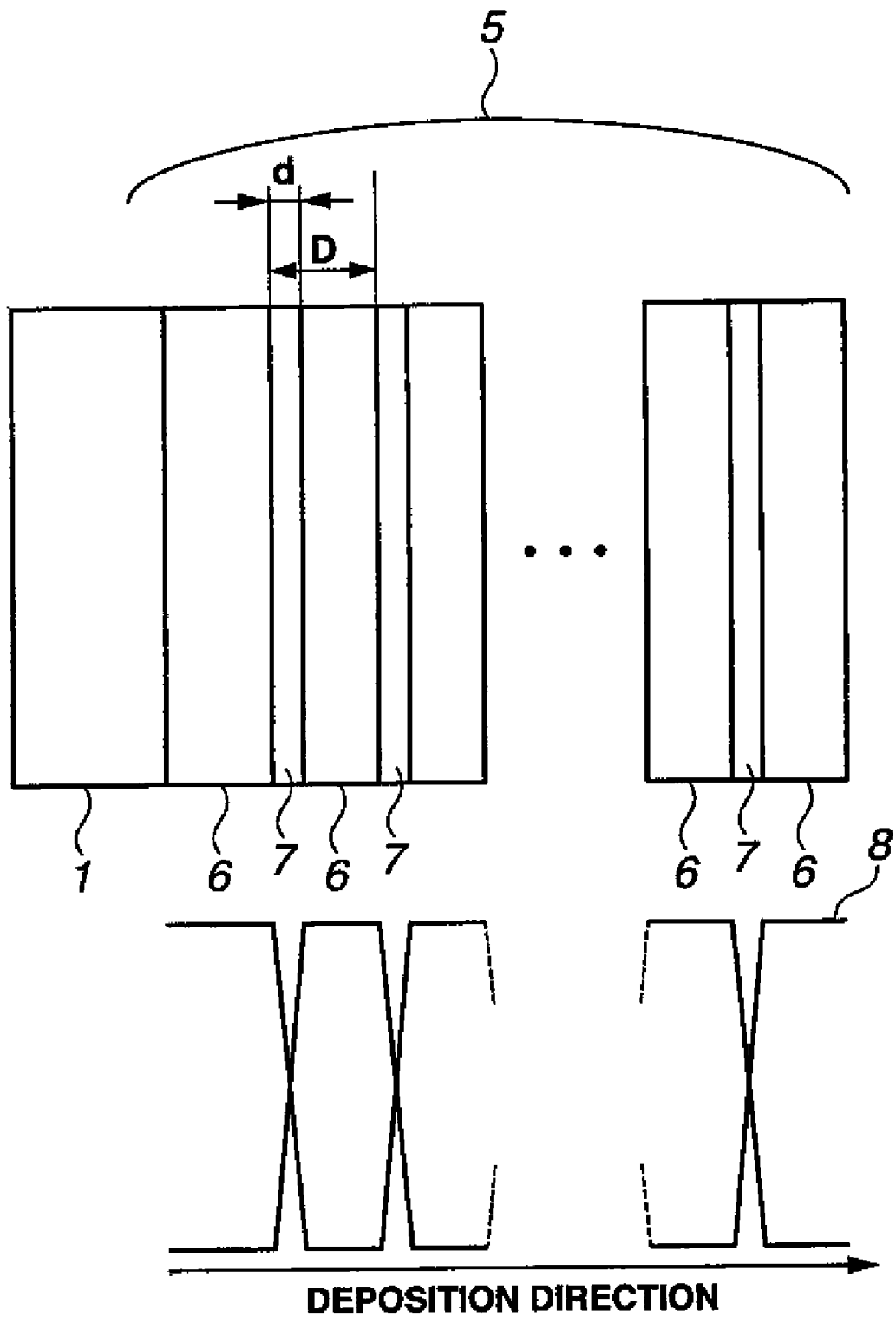
FIG. 12 illustrates the structure and compositional transition of a multilayer film in the first embodiment of the invention.

It is preferred that as shown in FIG. 12, a graded region 7 of moderately graded composition has a thickness d, which is at least 10% of a thickness D of a single layer coating 6 whose composition has transitioned through the graded region 7, inclusive of the thickness d of the graded region 7, that is, $d/D \geq 0.1$. The upper limit of d/D may be determined as appropriate, and is usually $d/D \leq 1$, especially $d/D=0.5$. If $d/D<0.1$, there is a possibility that line edge roughness becomes deteriorated. It is noted that the thickness D is preferably 3 to 600 Å, especially 10 to 300 Å. The total layer thickness of the multilayer film 5 is preferably 30 to 2,000 Å.

The method of preparing the multilayer film is described in further detail. First, a plurality of targets of various compositions are provided in a single sputtering chamber. For example, a metal silicide target such as molybdenum silicide is combined with a silicon target, or a metal target such as molybdenum is combined with a silicon target.

For one layer, an electric discharge may be induced to only one target for sputtering, or electric discharges may be induced to a plurality of targets at the same time for sputtering whereby film constituents sputtered from the respective targets are deposited in a combined fashion (generally referred to as co-sputtering). At this point, the substrate is desirably rotated about its axis so that the film constituents from the respective targets are uniformly mixed. A desired film composition is obtained by adjusting the powers of electric discharges applied across the respective targets.

When a multilayer film is deposited by sputtering a plurality of targets, the step of gradually changing a combination of electric powers applied across the targets in proximity to the interface between layers continues for a power grading time period which is preferably at least 10%, more preferably 20 to 50% of a time period required to complete deposition of each layer.

The multilayer film is prepared using the deposition system mentioned just above. Adjustment is done such that the electric discharge power across each target is gradually altered from a certain time prior to the completion of deposition of one layer until the composition of the next layer is reached. This results in a structure in which the composition and/or compositional ratio is gradually and moderately graded in proximity to the interface between layers.

Such a compositionally graded layer is obtainable by adjusting the electric discharge powers across the targets. By continuously changing the electric discharge powers across the targets, a graded layer whose composition varies substantially continuously is obtained. By stepwise or intermittently changing the electric discharge powers across the targets, a graded layer whose composition varies stepwise is obtained.

Specifically, when it is desired to deposit a layer of molybdenum silicide oxynitride (MoSiON), reactive sputtering is preferably carried out using molybdenum silicide as the target and a sputtering gas containing nitrogen and oxygen gases as well as argon gas.

The same applies when use is made of oxide or nitride of molybdenum silicide or another metal (e.g., zirconium) instead of molybdenum.

In this regard, the composition of oxide, nitride or oxynitride (oxide nitride) of metal silicide is preferably selected as appropriate from the range: Me (metal such as Mo, Zr)=more than 0 at % to 25 at %, preferably 0.2 to 25 at %, Si=10 to 33 at %, O=0 to 67 at %, and N=0 to 57 at %.

More specifically, for the oxide of molybdenum silicide (MoSiO), a composition: Mo=more than 0 at % to 25 at %, Si=10 to 33 at %, and O=33 to 67 at % is preferred; for the nitride of molybdenum silicide (MoSiN), a composition: Mo=more than 0 at % to 25 at %, Si=10 to 42 at %, and N=33 to 58 at % is preferred; for the oxynitride of molybdenum silicide (MoSiON), a composition: Mo=0.2 to 25 at %, Si=10 to 57 at %, O=1 to 60 at %, and N=6 to 57 at % is preferred. In the case of silicon oxide, nitride or oxynitride, the above-mentioned composition wherein Mo=0 at % is preferred.

In another embodiment wherein the laminate film is composed of metal coatings and is provided with a function of reflective film, for example, metals selected from Mo, Zr, Ti, Al, Au, Cu, Ag, Cr, Ni, Co, Pd, Pt, Si, etc. may be used in any desired combination. Elemental metals may be stacked, or alloys containing 1 to 50 at % of another metal may be stacked in combination. Inter alia, a combination of Mo with Si is preferred. In this case, elements Mo and Si may be separately stacked; alternatively, Mo alloy coatings containing 1 to 50 at % of another metal element and Si alloy coatings containing 1 to 50 at % of another metal element may be separately stacked.

In the first embodiment, the photomask is arrived at by patterning the multilayer film of the photomask blank prepared as described above.

Specifically, when a phase shift mask as shown in FIG. 2 is fabricated, a process involving forming a phase shift film (phase shift multilayer film in this embodiment) 2 on a substrate 1 as described above, then forming a resist film 13 thereon (FIG. 8A), patterning the resist film 13 by lithography (FIG. 8B), etching the phase shift film 2 (FIG. 8C), and thereafter, removing the resist film 13 (FIG. 8D) may be employed. Coating and patterning (exposure and development) of resist film, etching and removal of resist film may be performed by well-known methods.

Second Embodiment

The second embodiment of the invention pertains to a phase shift mask blank comprising a phase shift film 2 formed on a transparent substrate 1 which is transmissive to exposure light such as quartz and $CaF_2$, as shown in FIG. 1. The phase shift film includes at least two layers, a surface layer of a composition based on a zirconium silicide compound and a layer disposed adjacent to the substrate of a composition based on a molybdenum silicide compound, the composition being moderately graded between the layers. A phase shift mask is obtained by patterning the phase shift film of the phase shift mask blank. The phase shift mask has patterned phase shifters 2 as shown in FIG. 2, wherein first light-transmitting areas (exposed substrate areas) 1a are defined between the patterned phase shifters and second light-transmitting areas 2a are provided by the patterned phase shifters.

The layer of a zirconium silicide compound-based composition is disposed on the surface side of the phase shift film for improving chemical resistance and the layer of a molybdenum silicide compound-based composition is disposed adjacent to the substrate for providing the desired optical properties.

In this embodiment, as the zirconium concentration of the zirconium silicide compound-based layer decreases, a more amount of side etching occurs in this surface layer upon dry etching. Inversely, as the zirconium concentration increases, a less amount of side etching occurs in this surface layer. For example, where an etched cross-sectional geometry is inclined divergent toward the surface, the inclination can be compensated for by increasing the zirconium concentration of the surface layer. Then the cross-sectional geometry is corrected to a perpendicular one. Since the composition is moderately graded from the surface layer toward the substrate, no steps are formed in the etched cross-sectional geometry.

It is desired that the zirconium concentration [Zr] of the surface layer where the zirconium concentration becomes the highest divided by the molybdenum concentration [Mo] of the substrate adjacent layer where the molybdenum concentration becomes the highest be 0.1 to 2, that is, the molar ratio [Zr]/[Mo] be in the range between 0.1 and 2, more desirably between 0.2 and 1.5.

The zirconium silicide compound used herein is preferably an oxide, nitride or oxynitride. Similarly, the molybdenum silicide compound used herein is preferably an oxide, nitride or oxynitride.

In the second embodiment, the preferred phase shift mask blank has formed on a transparent substrate a phase shift film which is deposited by a reactive sputtering process using a sputtering gas containing an oxygen source gas and/or nitrogen source gas and formed of an oxide, nitride or oxynitride of metal silicide, has a transmittance to exposure light of several percents to several tens of percents, specifically about 3 to about 40%, and provides a phase difference of 180±5 degrees between light passing through the phase shifter and light passing through only the transparent substrate.

The method of preparing the phase shift film is described in further detail. First, a plurality of targets, a molybdenum silicide target, a zirconium silicide target and optionally a silicon target are provided in a single sputtering chamber. Electric discharges are induced to a plurality of targets at the same time for sputtering whereby film constituents sputtered from the respective targets are deposited in a combined fashion to achieve a desired film composition (generally referred to as co-sputtering). At this point, the substrate is desirably rotated so that the film constituents from the respective targets are uniformly mixed. A desired compositionally graded layer is obtained by adjusting the powers of electric discharges applied across the respective targets.

Specifically, when it is desired to deposit a layer of molybdenum silicide oxynitride (MoSiON) on the substrate side, reactive sputtering is preferably carried out using molybdenum silicide as the target and a sputtering gas containing nitrogen and oxygen gases as well as argon gas.

When it is desired to deposit a layer of zirconium silicide oxynitride (ZrSiON) on the surface side, reactive sputtering is preferably carried out using zirconium silicide as the target and a sputtering gas containing nitrogen and oxygen gases as well as argon gas.

In the second embodiment, the MoSiO layer preferably has a composition: Mo=0.2 to 25 at %, Si=10 to 33 at %, and O=33 to 60 at %. The MoSiN layer preferably has a composition: Mo=0.2 to 25 at %, Si=10 to 42 at %, and N=37 to 57 at %. The MoSiON layer preferably has a composition: Mo=0.2 to 25 at %, Si=10 to 42 at %, O=1 to 60 at %, and N=5 to 57 at %.

Also, the ZrSiO layer preferably has a composition: Zr=0.02 to 25 at %, Si=10 to 33 at %, and O=42 to 67 at %. The ZrSiN layer preferably has a composition: Zr=0.02 to 25 at %, Si=10 to 33 at %, and N=42 to 67 at %. The ZrSiON layer preferably has a composition: Zr=0.02 to 25 at %, Si=10 to 57 at %, O=1 to 60 at %, and N=5 to 57 at %.

In a preferred embodiment wherein a layer of a moderately graded composition is disposed as an intermediate layer between the MoSi compound layer on the substrate side and the ZrSi compound layer on the surface side, this intermediate layer has an intermediate composition between the composition of the MoSi compound layer on the substrate side and the composition of the ZrSi compound layer on the surface side. The term "moderately graded composition" between two adjacent layers means that there may be either a continuous or stepwise transition from the composition of one layer to the composition of the other layer. In the latter case, the term designates at least 5 steps, especially 10 to 50 steps of compositional transition from the substrate side to the surface side (for example, the Mo amount decreases sequentially in at least 5 steps, especially 10 to 50 steps and/or the Zr amount increases sequentially in at least 5 steps, especially 10 to 50 steps).

Such a compositionally graded layer is obtainable by adjusting the electric discharge powers across the targets. By continuously changing the electric discharge powers across the targets, a graded layer whose composition varies substantially continuously is obtained. By stepwise or intermittently changing the electric discharge powers across the targets, a graded layer whose composition varies stepwise is obtained.

Preferably in the second embodiment, the substrate adjacent layer has a thickness of 20 to 1,000 Å, especially 40 to 600 Å; and the surface layer has a thickness of 20 to 1,000 Å, especially 40 to 600 Å. The graded layer has a thickness of 200 to 1,000 Å, especially 300 to 1,000 Å and 1/2 to 1/1, especially 1/1.5 to 1/1 of the thickness of the surface layer, in consideration of an ability to adequately control the etched cross-sectional geometry of the phase shift film.

In the second embodiment, the phase shift mask is arrived at by patterning the phase shift film of the phase shift mask blank prepared as described above.

Specifically, when a phase shift mask as shown in FIG. 2 is fabricated, a process involving forming a phase shift film 2 on a substrate 1 as described above, then forming a resist film 13 thereon (FIG. 8A), patterning the resist film 13 by lithography (FIG. 8B), etching the phase shift film 2 (FIG. 5C), and thereafter, removing the resist film 13 (FIG. 8D) may be employed. Coating and patterning (exposure and development) of resist film, etching and removal of resist film may be performed by well-known methods.

Third Embodiment

The third embodiment pertains to a phase shift mask blank comprising a substrate which is transparent to exposure light and a phase shift film thereon, the phase shift film having one side contacting the substrate and a surface side remote therefrom, wherein the phase shift film comprises a plurality of layers containing a metal and silicon in different compositional ratios which are stacked in such order that a layer having a higher etching rate is on the substrate side and a layer having a lower etching rate is on the surface side.

Figure 3:
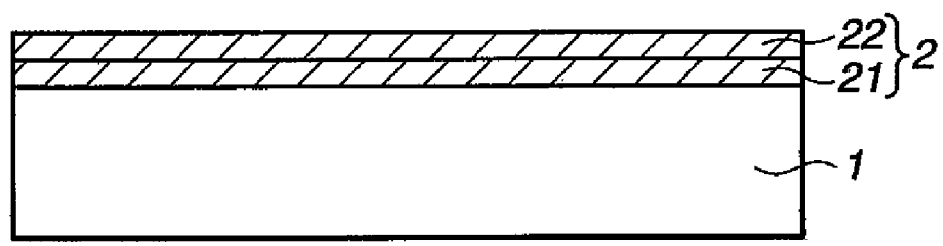
FIG. 3 is a cross-sectional view of a phase shift mask blank according to the third embodiment of the invention.

Specifically, as shown in FIG. 3, the phase shift mask blank includes a transparent substrate 1 which is transmissive to exposure light such as quartz or $CaF_2$ and a phase shift film 2 thereon. The phase shift film 2 comprises a plurality of layers, two layers 21 and 22 in the illustrated embodiment, containing a metal and silicon in different compositional ratios. The layers are stacked in such order that a layer 21 having a higher etching rate is on the substrate side and a layer 22 having a lower etching rate is on the surface side.

In the third embodiment, the phase shift film comprises a metal silicide compound such as a metal silicide oxide, metal silicide nitride, metal silicide oxynitride, metal silicide oxycarbide, metal silicide nitride carbide or metal silicide oxide nitride carbide. Typically the metal is molybdenum. Preference is then given to a molybdenum silicide compound such as a molybdenum silicide oxide (MoSiO), molybdenum silicide nitride (MoSiN), molybdenum silicide oxynitride (MoSiON), molybdenum silicide oxycarbide (MoSiOC), molybdenum silicide nitride carbide (MoSiNC) or molybdenum silicide oxide nitride carbide (MoSiONC).

In the third embodiment, especially where the metal is molybdenum, that is, where the phase shift film comprises molybdenum silicide compounds as listed above, the layers in the phase shift film are preferably stacked such that the compositional ratio of silicon to molybdenum increases from the substrate side to the surface side.

The composition of the molybdenum silicide compound is not particularly limited. The molybdenum silicide oxide (MoSiO) preferably has a composition: Mo=1 to 30 at %, Si=25 to 60 at %, and O=30 to 80 at %; and the molybdenum silicide nitride (MoSiN) preferably has a composition: Mo=1 to 30 at %, Si=25 to 60 at %, and N=30 to 80 at %.

More specifically, for the molybdenum silicide oxynitride (MoSiON), a composition: Mo=1 to 30 at %, Si=25 to 60 at %, O=1 to 40 at %, and N=1 to 60 at % is preferred; for the molybdenum silicide oxycarbide (MoSiOC), a composition: Mo=1 to 30 at %, Si=25 to 60 at %, 0=20 to 70 at %, and C=1 to 30 at % is preferred; for the molybdenum silicide nitride carbide (MoSiNC), a composition: Mo=1 to 30 at %, Si=25 to 60 at %, N=20 to 70 at %, and C=1 to 30 at % is preferred; for the molybdenum silicide oxide nitride carbide (MoSiONC), a composition: Mo=1 to 30 at %, Si=25 to 60 at %, O=1 to 40 at %, N=1 to 60 at %, and C=1 to 30 at % is preferred In the phase shift mask blank of the third embodiment of the invention, the phase shift film may be a stack of a plurality of phase shift layers formed of different metal compounds.

In the phase shift mask blank of the third embodiment of the invention, it is preferred that a distribution of phase difference (i.e., phase difference between incident exposure light and light transformed by the phase shifter) in a substrate plane (i.e., at each position where exposure light is transmitted) at the wavelength of light used for exposure have a center value of 180±10 degrees, and a transmittance distribution in a substrate plane have a center value of 3 to 40%. Further preferably, the phase difference distribution in a substrate plane is within ±2.0 degrees relative to its center value, and the transmittance distribution in a substrate plane is within ±0.15% relative to its center value.

In the phase shift mask blank of the third embodiment of the invention, the phase shift film comprises a plurality of stacked layers containing a metal and silicon in which the compositional ratio of silicon to metal is different between layers. Such a phase shift film can be deposited, for example, by sputtering using a metal silicide target. By forming the phase shift film on a substrate which is transparent to exposure light, a phase shift mask blank is manufactured. When layers are deposited in stack, the compositional ratio (atomic ratio) of silicon to metal in each layer of the phase shift film being deposited can be changed by using, for every layer to be deposited, a metal silicide target having a compositional ratio corresponding to the compositional ratio of silicon to metal in that layer. In the third embodiment, the phase shift mask blank is preferably manufactured by using a sputtering system capable of simultaneously causing at least two targets to produce electric discharges, and sputtering a combination of at least two metal silicide targets, or a combination of at least one metal silicide target with a metal target or a silicon target or both, thereby depositing layers on the substrate to form the phase shift film. Specifically, electric discharges may be induced to a plurality of targets at the same time for sputtering whereby film constituents sputtered from the respective targets are deposited in a combined fashion to form a layer of desired composition (generally referred to as co-sputtering). At this point, the substrate is desirably rotated by means of a drive mechanism in the sputtering system so that the film constituents from the respective targets are uniformly mixed.

In the preferred embodiment using a sputtering system capable of simultaneously producing electric discharges on at least two targets wherein a plurality of targets are combined as described above, simply by setting the input powers across the targets so that the compositional ratio of silicon to metal in each layer of the phase shift film being deposited may become a desired value, layers having different compositional ratios of silicon to metal can be continuously deposited without a need to exchange the targets.

More particularly, when it is desired to increase the compositional ratio of silicon to metal, this can be achieved by increasing the input power across a metal silicide target having a higher silicon proportion or a silicon target or by reducing the input power across a metal silicide target having a lower silicon proportion or a metal target. Similarly, when it is desired to reduce the compositional ratio of silicon to metal, this can be achieved by reducing the input power across a metal silicide target having a higher silicon proportion or a silicon target or by increasing the input power across a metal silicide target having a lower silicon proportion or a metal target. It is also possible to effect deposition while achieving a continuous compositional transition in each of the layers of the phase shift film.

As to the number of targets used, there may be used one target for each target type having a particular composition or a plurality of targets for each target type. In one embodiment, an identical number of targets are used for all the target types. In another embodiment, only one target is used for some target types and a plurality of targets are used for the remaining target types.

When a mask pattern is formed by etching, especially reactive ion etching (RIE), the perpendicularity at the boundary between the phase shift film and the etched-away portion can be adjusted by depositing the phase shift film, in which layers having varying compositional ratios of silicon to metal are stacked, by the above-described method. By stacking layers such that a layer having a higher etching rate is on the substrate side and a layer having a lower etching rate is on the surface side of the phase shift film, a phase shift mask having good perpendicularity in etched cross-sectional geometry is obtainable. The number of layers in the phase shift film is not limited to two, and three or more layers may be included. The upper limit is preferably up to ten layers, though not critical. The composition may be continuously varied to such an extent that no substantially sensible interface develops between layers in a film thickness direction.

The input power across each target is not particularly limited and may be selected as appropriate as long as targets, especially a metal silicide target (i.e., a silicon-containing target) and a silicon target can produce stable electric discharges. An input power per unit area of 0.2 to 20 W/cm$^2$ is preferred.

The phase shift mask blank of the third embodiment is manufactured by sputtering targets to deposit layers of the phase shift film. The targets used for the deposition of layers of metal silicide or metal silicide compound are a combination of at least two metal silicide targets, or a combination of at least one metal silicide target with a metal target or a silicon target or both. Particularly for the deposition of layers of molybdenum silicide or molybdenum silicide compound, a combination of at least two molybdenum silicide targets or a combination of at least one molybdenum silicide target with a molybdenum target or a silicon target or both is used. Further a metal silicide having one or both of oxygen and nitrogen added thereto may be used in order to maintain a constant composition of layer.

Figure 4:
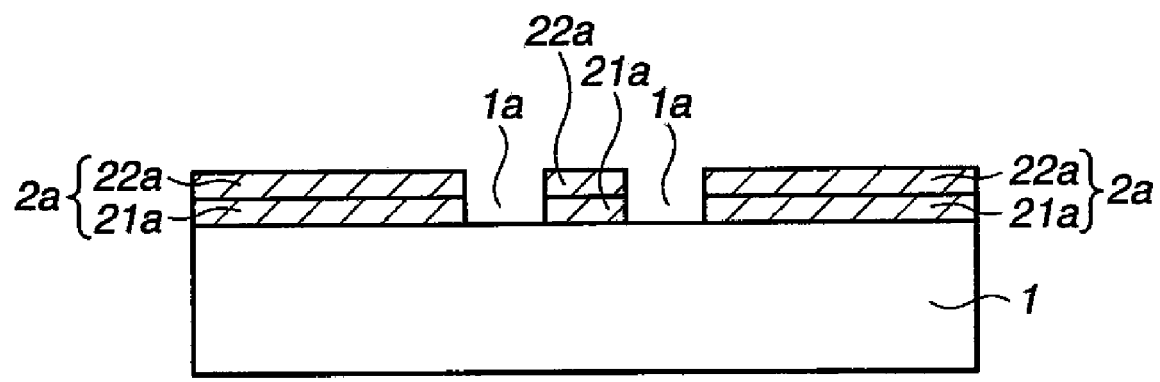
FIG. 4 is a cross-sectional view of a phase shift mask according to the third embodiment of the invention.

In the third embodiment, a phase shift mask is obtained by patterning the phase shift film of the aforementioned phase shift mask blank. The phase shift mask has patterned phase shifters as shown in FIG. 4, wherein first light-transmitting areas (exposed substrate areas) 1a are defined between the patterned phase shifters and second light-transmitting areas 2a are provided by the patterned phase shifters. It is noted that a layer 21a in FIG. 4 corresponds to the layer 21 having a higher etching rate in FIG. 3, and a layer 22a in FIG. 4 corresponds to the layer 22 having a lower etching rate in FIG. 3.

Such a phase shift mask may be fabricated by forming a resist pattern on the phase shift film of the phase shift mask blank by lithography, etching away those portions of the phase shift film which are not covered with the resist film, and then removing the resist film.

Specifically, when a phase shift mask as shown in FIG. 4 is fabricated, a process involving forming a phase shift film 2 on a substrate 1 as described above, then forming a resist film 13 thereon (FIG. 8A), patterning the resist film 13 by lithography (FIG. 8B), etching the phase shift film 2 (FIG. 8C), and thereafter, removing the resist film 13 (FIG. 8D) may be employed. Coating and patterning (exposure and development) of resist film, etching and removal of resist film may be performed by well-known methods.

Features Common to First, Second and Third Embodiments

In the first, second and third embodiments of the invention, the sputtering process may employ a direct-current power supply (DC sputtering) or a high-frequency power supply (RF sputtering). Either a magnetron sputtering system or a conventional sputtering system may be used.

The sputtering gas used herein may be an inert gas such as argon, neon, krypton or xenon. The present invention favors reactive sputtering using a reactive gas. The sputtering becomes reactive sputtering when the reactive gas selected from $N_2$ gas, $O_2$ gas, nitrogen oxide gases such as NO, $NO_2$ and $N_2O$, and carbon oxide gases such as CO and $CO_2$ is used along with the inert gas. By adjusting the amount of reactive gas, the phase shift film deposited is given a desired metal silicide compound composition. The sputtering gases may be introduced into a sputtering chamber by feeding various sputtering gases separately into the chamber or feeding a mixture of some or all sputtering gases and the remaining gases, if any, into the chamber.

Where it is desired to increase the transmittance of a phase shift film to be deposited, it is recommended that the amounts of oxygen and/or nitrogen-containing gas in the sputtering gas flow be increased so that more oxygen and/or nitrogen are taken into the film, or a target having more oxygen and nitrogen previously added thereto be used as the sputtering target. It is noted that an excessive content of oxygen can have negative impacts such as detracting from the chemical resistance of a phase shift film being deposited or lowering the refractive index thereof so that a thicker film becomes necessary to accomplish a phase shift of 180 degrees. Then it is also effective to increase the transmittance, for example, by increasing the input power across a target containing a relatively large amount of silicon or a silicon target for increasing the silicon content in a phase shift film being deposited.

Figure 5:
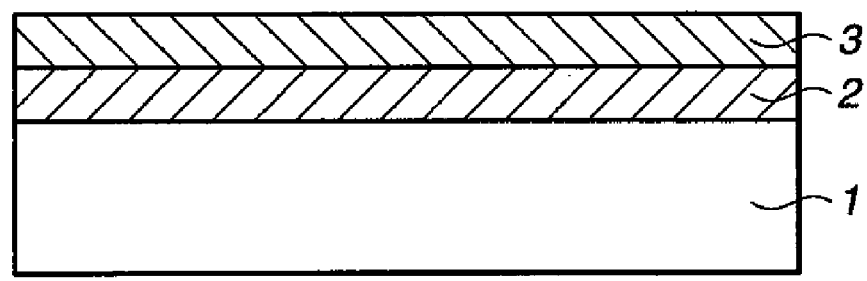
FIG. 5 is a cross-sectional view of a phase shift mask blank having a chromium base light-shielding film according to one embodiment of the invention.
Figure 6:
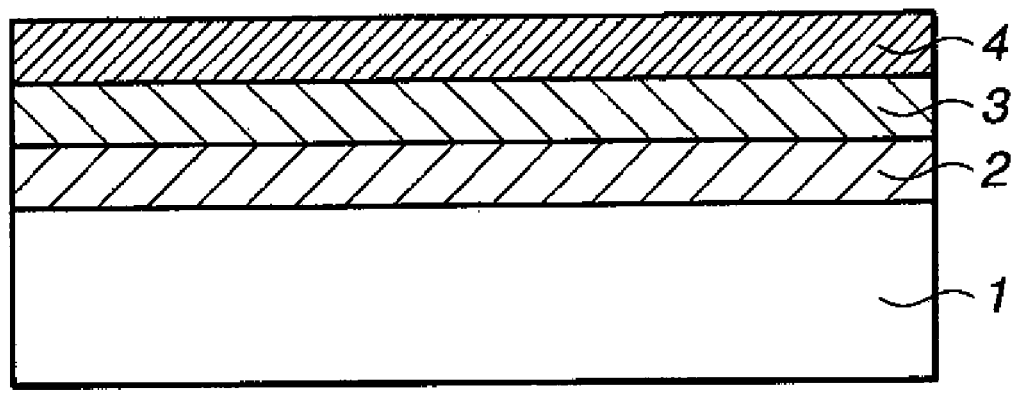
FIG. 6 is a cross-sectional view of a phase shift mask blank having a chromium base light-shielding film and a chromium base antireflection film according to another embodiment of the invention.
Figure 7:
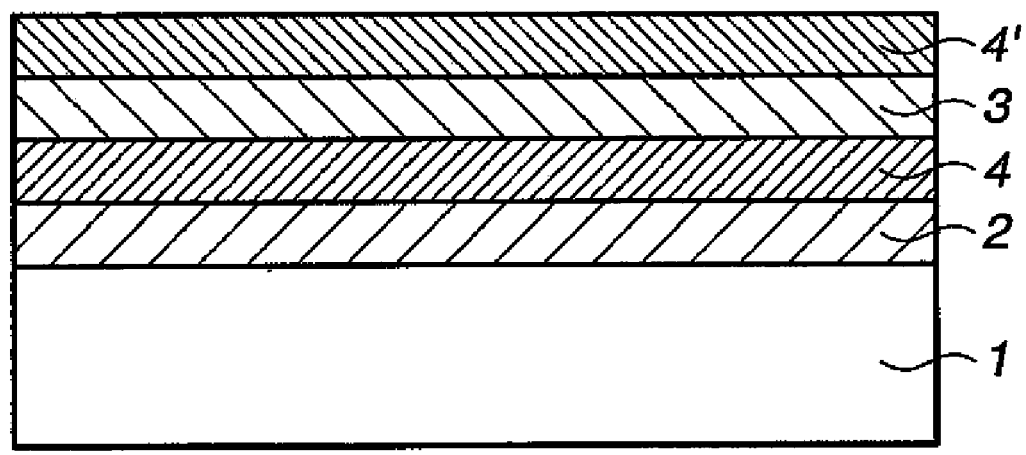
FIG. 7 is a cross-sectional view of a phase shift mask blank according to a further embodiment of the invention.

In another embodiment, the phase shift mask blank of the invention may include a chromium-base light-shielding film 3 which is formed on the phase shift film 2 as shown in FIG. 5. In yet another embodiment, as shown in FIG. 6, a chromium-base antireflection film 4 may be formed on the chromium-base light-shielding film 3 for reducing reflection from the chromium-base light-shielding film 3. In a still further embodiment, as shown in FIG. 7, a phase shift film 2, a first Cr base antireflection film 4, a Cr base light-shielding film 3, and a second Cr base antireflection film 4' are formed on the substrate 1 in order.

The light-shielding film or antireflection film used herein may be a chromium base film such as chromium oxycarbide (CrOC) or chromium oxide nitride carbide (CrONC) or a laminate of such films.

The chromium-base light-shielding film or antireflection film may be deposited by reactive sputtering. Specifically the target used is chromium alone or a compound of chromium combined with oxygen, nitrogen or carbon or a mixture thereof. The sputtering gas used is a mixture of an inert gas and a reactive gas.

In one example where a CrONC film is to be deposited, the sputtering gas may be a mixture of at least one carbon-containing gas such as $CH_4$, Co, and CO, at least one nitrogen-containing gas such as NO, $NO_2$ and $N_2$, at least one oxygen-containing gas such as $CO_2$, NO and $O_2$, and an inert gas such as Ar, Ne, Kr and Xe. The use of $CO_2$ gas as the carbon and oxygen source gases is especially preferred for uniformity in a substrate plane and ease of control during the deposition process. The sputtering gases may be introduced into a sputtering chamber by feeding various sputtering gases separately into the chamber or feeding a mixture of some or all sputtering gases and the remaining gases, if any, into the chamber.

It is preferred that the CrOC film have a composition consisting essentially of 20 to 95 at %, especially 30 to 85 at % of Cr, 1 to 30 at %, especially 5 to 20 at % of C, and 1 to 60 at %, especially 5 to 50 at % of O; and the CrONC film have a composition consisting essentially of 20 to 95 at %, especially 30 to 80 at % of Cr, 1 to 20 at %, especially 2 to 15 at % of C, 1 to 60 at %, especially 5 to 50 at % of O, and 1 to 30 at %, especially 3 to 20 at % of N.

Figure 9:
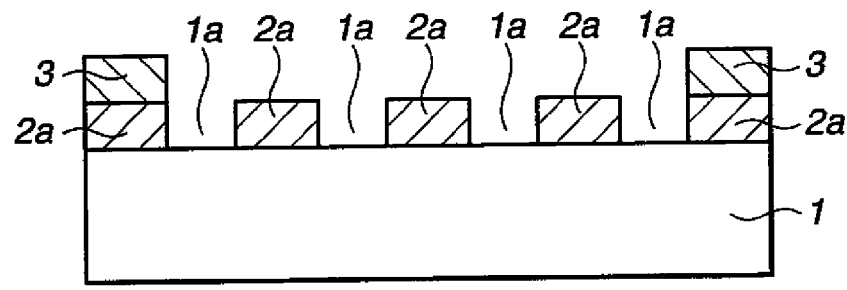
FIG. 9 is a cross-sectional view of a phase shift mask according to a still further embodiment of the invention.
Figure 10A:
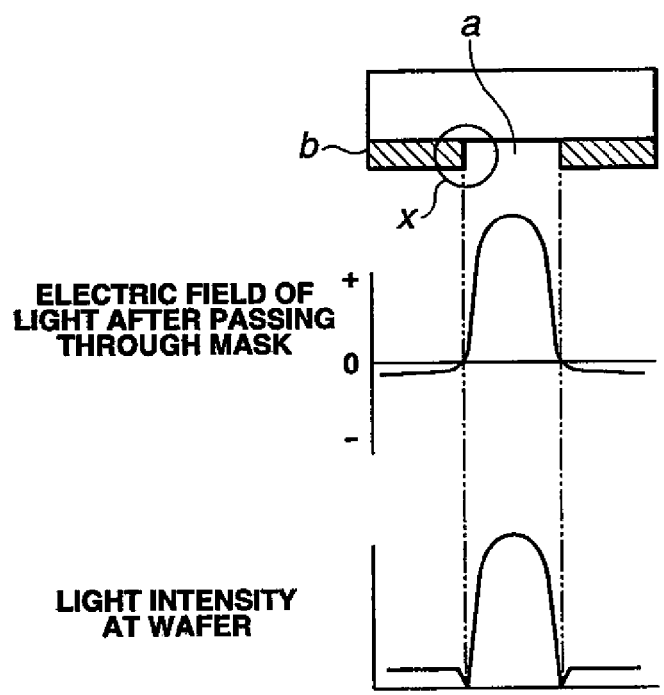
FIGS. 10A and 10B illustrate the operating principle of a halftone phase shift mask, FIG. 10B being an enlarged view of region X in FIG. 10A.
Figure 10B:
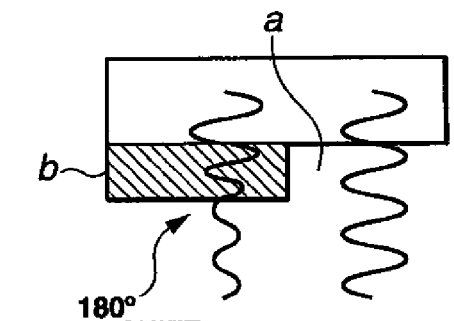

In cases where a chromium-based light-shielding and/or antireflection film is formed on the phase shift film, a phase shift mask on which the chromium-based film 3 remains at the peripheral edges of the substrate 1 (see FIG. 9) can be produced by etching away the chromium-based film in the regions that are necessary for light exposure, thereby leaving the surface of the phase shift film exposed, then patterning the phase shift film as described above. Alternatively, a phase shift mask can be produced by applying a resist to the chromium-based film and patterning the resist, then etching and patterning the chromium-based film and the phase shift film.

The regions of the chromium-based film which are necessary for light exposure are then removed by selective etching so as to leave the phase shift pattern exposed at the surface.

EXAMPLE

Examples and comparative examples are given below by way of illustration, and are not intended to limit the scope of the invention.

First Embodiment

Example 1

A multilayer film (phase shift multilayer film) was prepared by depositing alternate layers of molybdenum silicide oxynitride (MoSiON) and silicon oxynitride (SiON).

Figure 11:
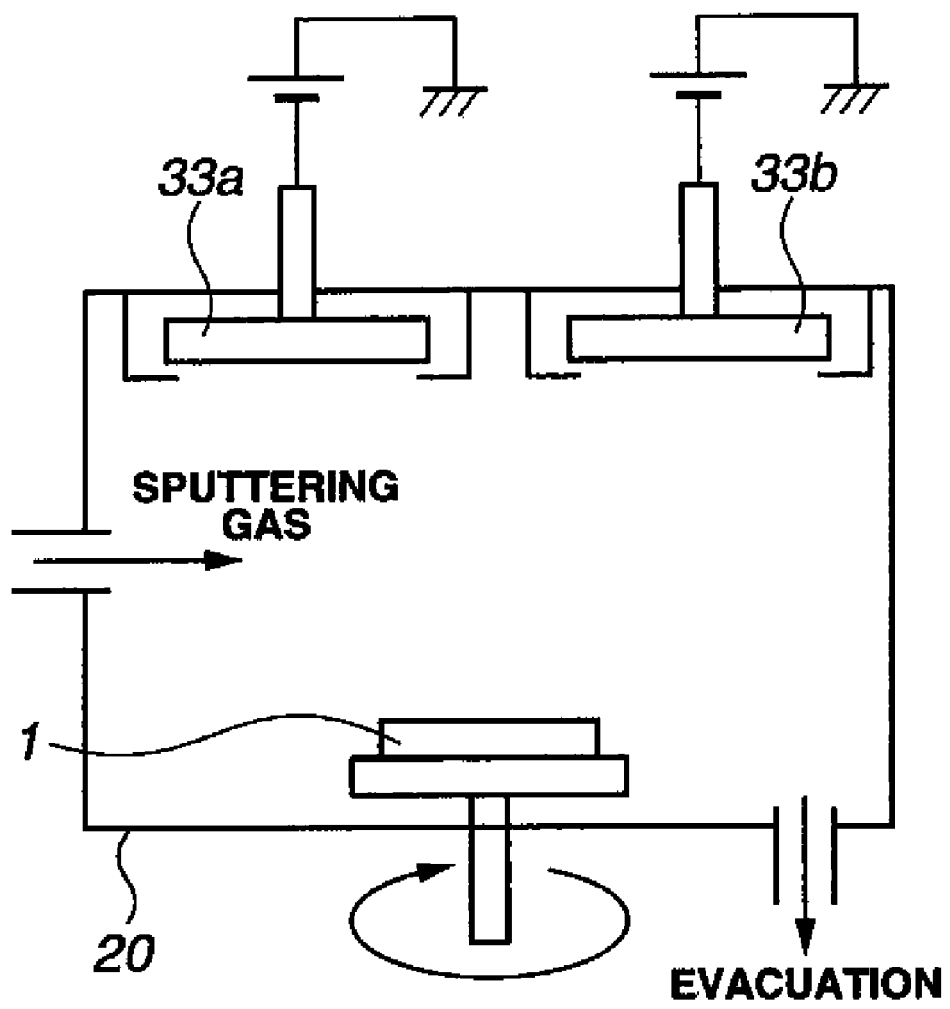
FIG. 11 schematically illustrates a dc sputtering system used in Examples 1-7 and Comparative Examples 1-4.

For the deposition, a dc sputtering system including two targets 33a and 33b as shown in FIG. 11 was used. The target 33a for MoSiON layers was a MoSi$_{3.5}$ target and the target 33b for SiON layers was a Si target. The sputtering gas was a gas mixture of 20 cm$^3$/min of Ar, 100 cm$^3$/min of N$_2$ and 5 cm$^3$/min of O$_2$. A gas pressure of 0.2 Pa was set for sputtering.

While a quartz substrate 1 was rotated at 30 rpm, an electric discharge power of 1,000 W was applied across the MoSi$_{3.5}$ target for sputtering, depositing MoSiON on the substrate to form a first layer to a thickness of 270 Å. Then the discharge power across the MoSi$_{3.5}$ target was gradually reduced while the discharge power across the Si target was gradually increased. The transition process was controlled such that the discharge power across the MoSi$_{3.5}$ target became 0 W and the discharge power across the Si target became 1,000 W at the time when the layer reached a thickness of 305 Å from the start of MoSiON deposition. The transition to deposition of SiON was completed in this way. The controlled process formed a compositionally graded region having a d/D ratio of 0.1.

Next, the discharge power across the Si target was gradually reduced to 0 W while the discharge power across the MoSi$_{3.5}$ target was gradually increased to 1,000 W. Subsequently, similar procedures were repeated to deposit layers alternately, eventually producing a multilayer film having four layers in total.

Line Edge Roughness (LER) Test

Figure 8A:
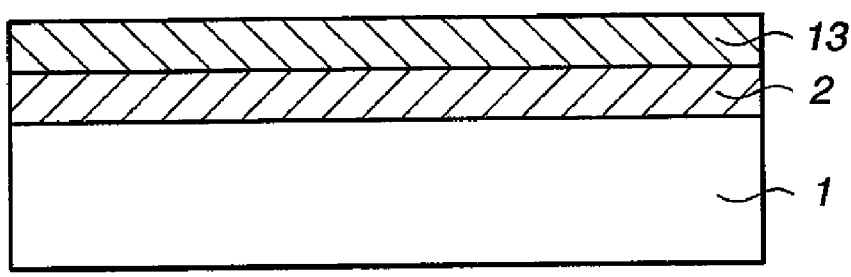
FIG. 8 schematically illustrates a method of manufacturing a phase shift mask, FIG. 8A showing a configuration having a resist film as formed, FIG. 8B showing a patterned resist film, FIG. 8C showing a configuration after etching, and FIG. 8D showing a configuration with the resist film removed.
Figure 8B:
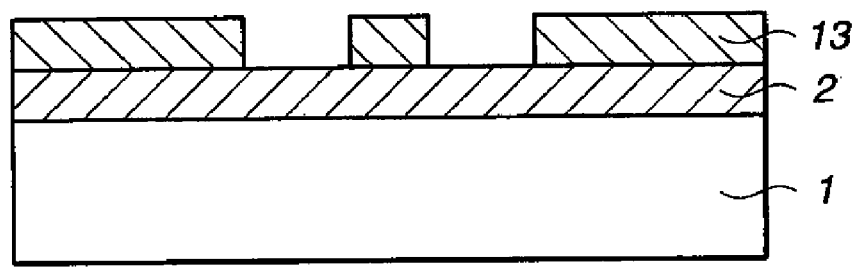
Figure 8C:
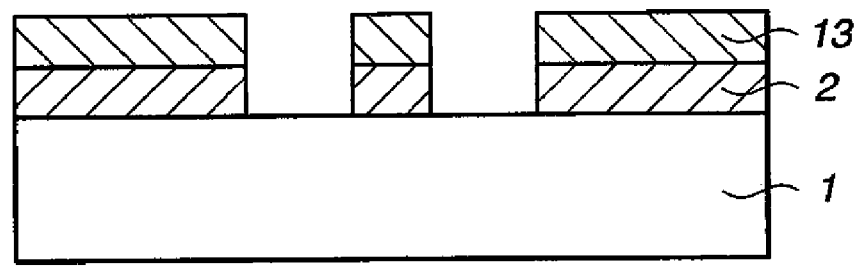
Figure 8D:
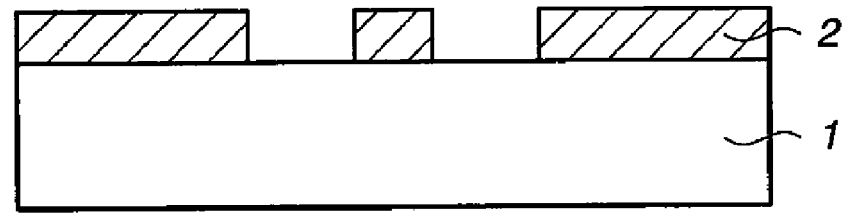

On the multilayer film (phase shift multilayer film) produced under the above-described conditions, a resist film 13 was formed as shown in FIG. 8A. The resist film 13 was patterned as shown in FIG. 8B, the phase shift film (phase shift multilayer film) 2 was dry etched as shown in FIG. 8C, and thereafter, the resist film 13 was removed as shown in FIG. 8D. The pattern thus formed was observed. The patterned multilayer film was measured for line edge roughness, finding a satisfactory LER value of 10 nm.

Example 2

A multilayer film (phase shift multilayer film) was prepared by depositing alternate layers of molybdenum silicide oxynitride (MoSiON) and silicon oxynitride (SiON).

For the deposition, a dc sputtering system including two targets as shown in FIG. 11 was used. The target for MoSiON layers was a MoSi$_{3.5}$ target and the target for SiON layers was a Si target. The sputtering gas was a gas mixture of 20 cm$^3$/min of Ar, 100 cm$^3$/min of N$_2$ and 5 cm$^3$/min of O$_2$. A gas pressure of 0.2 Pa was set for sputtering.

While a quartz substrate was rotated at 30 rpm, an electric discharge power of 1,000 W was applied across the MoSi$_{3.5}$ target for sputtering, depositing MoSiON on the substrate to form a first layer to a thickness of 240 Å. Then the discharge power across the MoSi$_{3.5}$ target was gradually reduced while the discharge power across the Si target was gradually increased. The transition process was controlled such that the discharge power across the MoSi$_{3.5}$ target became 0 W and the discharge power across the Si target became 1,000 W at the time when the layer reached a thickness of 310 Å from the start of MoSiON deposition. The transition to deposition of SiON was completed in this way. The controlled process formed a compositionally graded region having a d/D ratio of 0.2.

Next, the discharge power across the Si target was gradually reduced to 0 W while the discharge power across the MoSi$_{3.5}$ target was gradually increased to 1,000 W. Subsequently, similar procedures were repeated to deposit layers alternately, eventually producing a multilayer film having four layers in total.

Line Edge Roughness (LER) Test

On the multilayer film (phase shift multilayer film) produced under the above-described conditions, a resist film 13 was formed as shown in FIG. 8A. The resist film 13 was patterned as shown in FIG. 8B, the phase shift film (phase shift multilayer film) 2 was dry etched as shown in FIG. 8C, and thereafter, the resist film 13 was removed as shown in FIG. 8D. The pattern thus formed was observed. The patterned multilayer film was measured for line edge roughness, finding a satisfactory LER value of 8 nm.

Example 3

A multilayer film (phase shift multilayer film) was prepared by depositing alternate layers of molybdenum silicide oxynitride (MoSiON) and silicon oxynitride (SiON).

For the deposition, a dc sputtering system including two targets as shown in FIG. 11 was used. The target for MoSiON layers was a MoSi$_{3.5}$ target and the target for SiON layers was a Si target. The sputtering gas was a gas mixture of 20 cm$^3$/min of Ar, 100 cm$^3$/min of N$_2$ and 5 cm$^3$/min of O$_2$. A gas pressure of 0.2 Pa was set for sputtering.

While a quartz substrate was rotated at 30 rpm, an electric discharge power of 1,000 W was applied across the MoSi$_{3.5}$ target for sputtering, depositing MoSiON on the substrate to form a first layer to a thickness of 190 Å. Then the discharge power across the MoSi$_{3.5}$ target was gradually reduced while the discharge power across the Si target was gradually increased. The transition process was controlled such that the discharge power across the MoSi$_{3.5}$ target became 0 W and the discharge power across the Si target became 1,000 W at the time when the layer reached a thickness of 203 Å from the start of MoSiON deposition. The transition to deposition of SiON was completed in this way. The controlled process formed a compositionally graded region having a d/D ratio of 0.1.

Next, the discharge power across the Si target was gradually reduced to 0 W while the discharge power across the MoSi$_{3.5}$ target was gradually increased to 1,000 W. Subsequently, similar procedures were repeated to deposit layers alternately, eventually producing a multilayer film having six layers in total.

Line Edge Roughness (LER) Test

On the multilayer film (phase shift multilayer film) produced under the above-described conditions, a resist film 13 was formed as shown in FIG. 8A. The resist film 13 was patterned as shown in FIG. 8B, the phase shift film (phase shift multilayer film) 2 was dry etched as shown in FIG. 8C, and thereafter, the resist film 13 was removed as shown in FIG. 8D. The pattern thus formed was observed. The patterned multilayer film was measured for line edge roughness, finding a satisfactory LER value of 9 nm.

Example 4

A multilayer film (phase shift multilayer film) was prepared by depositing alternate layers of molybdenum (Mo) and silicon (Si).

For the deposition, a dc sputtering system including two targets as shown in FIG. 11 was used. The target for Mo layers was a Mo target and the target for Si layers was a Si target. Argon was fed at a flow rate of 70 cm$^3$/min as the sputtering gas. A gas pressure of 0.2 Pa was set for sputtering.

While a quartz substrate was rotated at 30 rpm, an electric discharge power of 1,000 W was applied across the Mo target for sputtering, depositing Mo on the substrate to form a first layer to a thickness of 27 Å. Then the discharge power across the Mo target was gradually reduced while the discharge power across the Si target was gradually increased. The transition process was controlled such that the discharge power across the Mo target became 0 W and the discharge power across the Si target became 1,000 W at the time when the layer reached a thickness of 34 Å from the start of Mo deposition. The transition to deposition of Si was completed in this way. The controlled process formed a compositionally graded region having a d/D ratio of 0.1.

Next, the discharge power across the Si target was gradually reduced to 0 W while the discharge power across the Mo target was gradually increased to 1,000 W. Subsequently, similar procedures were repeated to deposit layers alternately, eventually producing a multilayer film having 40 layers in total.

Line Edge Roughness (LER) Test

On the multilayer film (phase shift multilayer film) produced under the above-described conditions, a resist film 13 was formed as shown in FIG. 8A. The resist film 13 was patterned as shown in FIG. 8B, the phase shift film (phase shift multilayer film) 2 was dry etched as shown in FIG. 8C, and thereafter, the resist film 13 was removed as shown in FIG. 8D. The pattern thus formed was observed. The patterned multilayer film was measured for line edge roughness, finding a satisfactory LER value of 6 nm.

Comparative Example 1

A multilayer film (phase shift multilayer film) was prepared by depositing layers of molybdenum silicide oxynitride (MoSiON) and silicon oxynitride (SiON).

For the deposition, a dc sputtering system including two targets as shown in FIG. 11 was used. The target for MoSiON layers was a MoSi$_{3.5}$ target and the target for SiON layers was a Si target. The sputtering gas was a gas mixture of 20 cm$^3$/min of Ar, 100 cm$^3$/min of N$_2$ and 5 cm$^3$/min of O$_2$. A gas pressure of 0.2 Pa was set for sputtering.

While a quartz substrate was rotated at 30 rpm, an electric discharge power of 1,000 W was applied across the MoSi$_{3.5}$ target for sputtering, depositing MoSiON on the substrate to form a first layer to a thickness of 540 Å. Then the discharge power across the MoSi$_{3.5}$ target was gradually reduced while the discharge power across the Si target was gradually increased. The transition process was controlled such that the discharge power across the MoSi$_{3.5}$ target became 0 W and the discharge power across the Si target became 1,000 W at the time when the layer reached a thickness of 610 Å from the start of MoSiON deposition. The transition to deposition of SiON was completed in this way. The controlled process formed a compositionally graded region having a d/D ratio of 0.1. Successively, a second layer was deposited, producing a multilayer film having two layers in total.

Line Edge Roughness (LER) Test

On the multilayer film (phase shift multilayer film) produced under the above-described conditions, a resist film 13 was formed as shown in FIG. 8A. The resist film 13 was patterned as shown in FIG. 8B, the phase shift film (phase shift multilayer film) 2 was dry etched as shown in FIG. 8C, and thereafter, the resist film 13 was removed as shown in FIG. 8D. The pattern thus formed was observed. The patterned multilayer film was measured for line edge roughness, finding an unsatisfactory LER value of 18 nm.

Comparative Example 2

A multilayer film (phase shift multilayer film) was prepared by depositing alternate layers of molybdenum silicide oxynitride (MoSiON) and silicon oxynitride (SiON).

For the deposition, a do sputtering system including two targets as shown in FIG. 11 was used. The target for MoSiON layers was a MoSi$_{3.5}$ target and the target for SiON layers was a Si target. The sputtering gas was a gas mixture of 20 cm$^3$/min of Ar, 100 cm$^3$/min of N$_2$ and 5 cm$^3$/min of O$_2$. A gas pressure of 0.2 Pa was set for sputtering.

While a quartz substrate was rotated at 30 rpm, an electric discharge power of 1,000 W was applied across the MoSi$_{3.5}$ target for sputtering, depositing MoSiON on the substrate to form a first layer to a thickness of 300 Å. The system was then switched so that an electric discharge power of 1,000 W was applied across the Si target for sputtering, depositing SiON to form a second layer. This switching resulted in a d/D ratio of 0. Layers were alternately deposited by similar procedure, producing a multilayer film having four layers in total.

Line Edge Roughness (LER) Test

On the multilayer film (phase shift multilayer film) produced under the above-described conditions, a resist film 13 was formed as shown in FIG. 8A. The resist film 13 was patterned as shown in FIG. 8B, the phase shift film (phase shift multilayer film) 2 was dry etched as shown in FIG. 8C, and thereafter, the resist film 13 was removed as shown in FIG. 8D. The pattern thus formed was observed. The patterned multilayer film was measured for line edge roughness, finding an unsatisfactory LER value of 16 nm.

The results of Examples 1 to 4 and Comparative Examples 1 and 2 are summarized in Table 1.

TABLE 1

| No. | Layer 1 | | Layer 2 | | Number of layers | d/D ratio of graded region | LER (nm) |
|---|---|---|---|---|---|---|---|
| | Composition | Thickness (Å) | Composition | Thickness (Å) | | | |
| Example 1 | MoSiON | 300 | SiON | 50 | 4 | 0.10 | 10 |
| Example 2 | MoSiON | 300 | SiON | 50 | 4 | 0.20 | 8 |
| Example 3 | MoSiON | 200 | SiON | 33 | 6 | 0.10 | 9 |
| Example 4 | Mo | 30 | Si | 40 | 40 | 0.10 | 6 |

TABLE 1-continued

| No. | Layer 1 Composition | Layer 1 Thickness (Å) | Layer 2 Composition | Layer 2 Thickness (Å) | Number of layers | d/D ratio of graded region | LER (nm) |
|---|---|---|---|---|---|---|---|
| Comparative Example 1 | MoSiON | 600 | SiON | 100 | 2 | 0.10 | 18 |
| Comparative Example 2 | MoSiON | 300 | SiON | 50 | 4 | 0 | 16 |

It is seen from these results that the multilayer films within the scope of the invention are useful as photomasks by virtue of a fully reduced line edge roughness.

Second Embodiment

Example 5

A phase shift multilayer film was prepared using a dc sputtering system including two targets 33a and 33b as shown in FIG. 11. The target 33a used for molybdenum silicide compound layers was a $MoSi_4$ target and the target 33b used for zirconium silicide compound layers was a $ZrSi_6$ target.

First, sputtering was started by applying an electric discharge power of 1,000 W across the $MoSi_4$ target, depositing a molybdenum silicide compound on a quartz substrate. As deposition took place, the power across the $MoSi_4$ target was gradually reduced. On the other hand, at the same time as the start of electric discharge by the $MoSi_4$ target, a gradually increasing electric discharge power was applied across the ZrSi, target. The transition process was controlled such that the discharge power across the $MoSi_4$ target became 0 W and the discharge power across the $ZrSi_6$ target became 500 W at the time when the layer reached a thickness of 700 Å.

The sputtering gas introduced into the system was a gas mixture of 20 $cm^3$/min of Ar, 100 $cm^3$/min of $N_2$ and 5 $cm^3$/min of $O_2$. A gas pressure of 0.2 Pa was set for sputtering. The substrate was rotated at 30 rpm.

The deposition process was terminated when the layer reached a thickness of 750 Å, obtaining a phase shift film.

It is noted that a rough measure indicative of the molybdenum and zirconium concentrations in the compositions of the substrate adjacent layer and the surface layer is given by comparing the molybdenum and zirconium concentrations [Mo] and [Zr] in the respective targets. Under the experimental conditions, [Zr]/[Mo]=0.714.

Chemical Resistance

After one hour immersion in a chemical solution of aqueous ammonia, aqueous hydrogen peroxide and water in a volume ratio of 1:1:10 at 23° C., the blank was measured for transmittance to determine a change thereof. It is believed that those samples having better chemical resistance show less changes of transmittance before and after the chemical solution immersion. Measurement was made at a wavelength of 193 nm. The change of transmittance before and after the chemical solution immersion was 0.014.

Steps and Geometry of Etched Cross Section

On the phase shift film (phase shift multilayer film) produced by the above-described procedure, a resist film 13 was formed as shown in FIG. 8A. The resist film 13 was patterned as shown in FIG. 5B, the phase shift film (phase shift multilayer film) 2 was dry etched with $CF_4$ based gases as shown in FIG. 8C, and thereafter, the resist film 13 was removed as shown in FIG. 8D.

Figure 13:
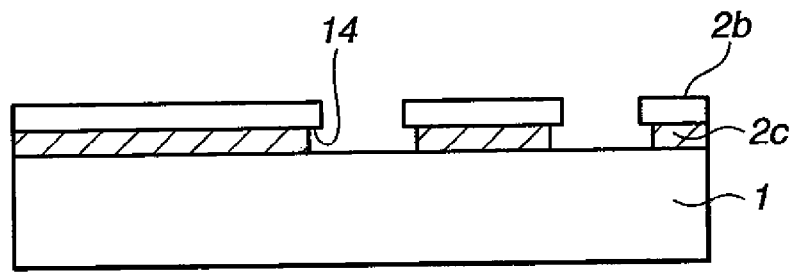
FIG. 13 is a cross-sectional view showing steps in an etched pattern in the second embodiment of the invention.

A cross section of the pattern thus formed was observed to examine the steps (depicted at 14 in FIG. 13) formed in etched cross section at the interface between the surface layer 2b and the lower layer 2c of the phase shift film. No definite steps were observed.

Figure 14:
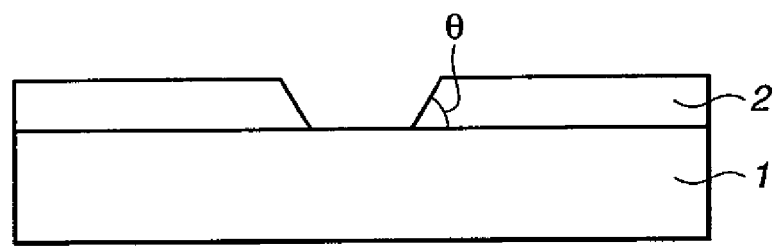
FIG. 14 is a cross-sectional view showing an etched pattern in the second embodiment of the invention.

The etched sidewall in the cross section of FIG. 14 had an angle θ of 86 degrees, indicating good perpendicularity.

Example 6

A phase shift multilayer film was prepared using a dc sputtering system including two targets as shown in FIG. 11. The target used for molybdenum silicide compound layers was a $MoSi_4$ target and the target used for zirconium silicide compound layers was a $ZrSi_4$ target.

First, sputtering was started by applying an electric discharge power of 1,000 W across the $MoSi_4$ target, depositing a molybdenum silicide compound on a quartz substrate. As deposition took place, the power across the $MoSi_4$ target was gradually reduced. On the other hand, at the same time as the start of electric discharge by the $MoSi_4$ target, a gradually increasing electric discharge power was applied across the $ZrSi_4$ target. The transition process was controlled such that the discharge power across the $MoSi_4$ target became 0 W and the discharge power across the $ZrSi_4$ target became 500 W at the time when the layer reached a thickness of 650 Å.

The sputtering gas introduced into the system was a gas mixture of 20 $cm^3$/min of Ar, 100 $cm^3$/min of $N_2$ and 5 $cm^3$/min of $O_2$. A gas pressure of 0.2 Pa was set for sputtering. The substrate was rotated at 30 rpm.

The deposition process was terminated when the layer reached a thickness of 700 Å, obtaining a phase shift film.

It is noted that a rough measure indicative of the molybdenum and zirconium concentrations in the compositions of the substrate adjacent layer and the surface layer is given by comparing the molybdenum and zirconium concentrations [Mo] and [Zr] in the respective targets. Under the experimental conditions, [Zr]/[Mo]=1.00.

As in Example 5, chemical resistance was examined, finding a change of transmittance of 0.009 before and after the chemical solution immersion. With respect to the etched cross section, no definite steps were observed. The etched sidewall in cross section had an angle θ of 88 degrees, indicating good perpendicularity.

Example 7

A phase shift multilayer film was prepared using a dc sputtering system including two targets as shown in FIG. 11. The target used for molybdenum silicide compound layers was a $MoSi_4$ target and the target used for zirconium silicide compound layers was a $ZrSi_{20}$ target.

First, sputtering was started by applying an electric discharge power of 1,000 W across the $MoSi_4$ target, depositing a molybdenum silicide compound on a quartz substrate. As deposition took place, the power across the MoSi$_4$ target was gradually reduced. On the other hand, at the same time as the start of electric discharge by the MoSi$_4$ target, a gradually increasing electric discharge power was applied across the ZrSi$_{20}$ target. The transition process was controlled such that the discharge power across the MoSi$_4$ target became 0 W and the discharge power across the ZrSi$_{20}$ target became 500 W at the time when the layer reached a thickness of 800 Å.

The sputtering gas introduced into the system was a gas mixture of 20 cm$^3$/min of Ar, 100 cm$^3$/min of N$_2$ and 5 cm$^3$/min of O$_2$. A gas pressure of 0.2 Pa was set for sputtering. The substrate was rotated at 30 rpm.

The deposition process was terminated when the layer reached a thickness of 850 Å, obtaining a phase shift film.

It is noted that a rough measure indicative of the molybdenum and zirconium concentrations in the compositions of the substrate adjacent layer and the surface layer is given by comparing the molybdenum and zirconium concentrations [Mo] and [Zr] in the respective targets. Under the experimental conditions, [Zr]/[Mo]=0.238.

As in Example 5, chemical resistance was examined, finding a change of transmittance of 0.008 before and after the chemical solution immersion. With respect to the etched cross section, no definite steps were observed. The etched sidewall in cross section had an angle θ of 92 degrees, indicating good perpendicularity.

Comparative Example 3

A dc sputtering system including two targets as shown in FIG. 11 was used. This Comparative Example used only MoSi$_4$ as the target for molybdenum silicide compound.

While a quartz substrate was rotated at 30 rpm, an electric discharge power of 1,000 W was applied across the MoSi$_4$ target for sputtering, depositing a molybdenum silicide compound layer of 500 Å thick on the substrate. The sputtering gas introduced into the system was a gas mixture of 20 cm$^3$/min of Ar, 100 cm$^3$/min of N$_2$ and 5 cm$^3$/min of O$_2$. A gas pressure of 0.2 Pa was set for sputtering.

As in Example 5, chemical resistance was examined, finding a change of transmittance of 0.110 before and after the chemical solution immersion, i.e., poor chemical resistance. With respect to the etched cross section, no steps were observed because of a molybdenum silicide single layer film. The etched sidewall in cross section had an angle θ of 76 degrees, which is practically less acceptable.

Comparative Example 4

A phase shift multilayer film was prepared using a dc sputtering system including two targets as shown in FIG. 11. A MoSi$_4$ target was used as the target for molybdenum silicide compound layers and a ZrSi$_4$ target was used as the target for zirconium silicide compound layers.

While a quartz substrate was rotated at 30 rpm, an electric discharge power of 1,000 W was first applied across the MoSi$_4$ target for sputtering, depositing a first layer of 500 Å thick on the substrate. The sputtering gas introduced into the system was a gas mixture of 20 cm$^3$/min of Ar, 100 cm$^3$/min of N$_2$ and 5 cm$^3$/min of O$_2$. A gas pressure of 0.2 Pa was set for sputtering.

Next, an electric discharge power of 500 W was applied across the ZrSi$_4$ target for sputtering, depositing a second layer of 200 Å thick. The depositing conditions were the same as used for the first layer.

It is noted that a rough measure indicative of the molybdenum and zirconium concentrations in the compositions of the substrate adjacent layer and the surface layer is given by comparing the molybdenum and zirconium concentrations [Mo] and [Zr] in the respective targets. Under the experimental conditions, [Zr]/[Mo]=1.000.

As in Example 5, chemical resistance was examined, finding a change of transmittance of 0.014 before and after the chemical solution immersion. With respect to the etched cross section, steps of about 4 nm were observed. The etched sidewalls in cross section for each layer were inclined, and in the most inclined areas, had an angle θ of 78 degrees, which is practically less acceptable.

The results of Examples 5 to 7 and Comparative Examples 3 and 4 are summarized in Table 2.

TABLE 2

| No. | 1st layer Target | 2nd layer Target | Layer configuration | [Zr]/[Mo] (target composition ratio) | θ (deg) | Chemical resistance |
| --- | --- | --- | --- | --- | --- | --- |
| Example 5 | MoSi$_4$ | ZrSi$_6$ | graded | 0.714 | 86 | 0.014 |
| Example 6 | MoSi$_4$ | ZrSi$_4$ | graded | 1.000 | 88 | 0.009 |
| Example 7 | MoSi$_4$ | ZrSi$_{20}$ | graded | 0.238 | 92 | 0.008 |
| Comparative Example 3 | MoSi$_4$ | | 1 layer | — | 76 | 0.110 |
| Comparative Example 4 | MoSi$_4$ | ZrSi$_4$ | 2 layers | 1.000 | 78 | 0.014 |

According to the invention, in a phase shift mask blank having a phase shift film of two or more layers on a transparent substrate, the phase shift film has a zirconium silicide compound-based composition on a surface side and a molybdenum silicide compound-based composition on a substrate side, and includes at least one layer of a moderately graded composition. There are thus provided a phase shift mask blank and a phase shift mask which exhibit an improved etched cross-sectional geometry following mask pattern formation and good chemical resistance while satisfying optical properties.

Third Embodiment

Example 8

Figure 15:
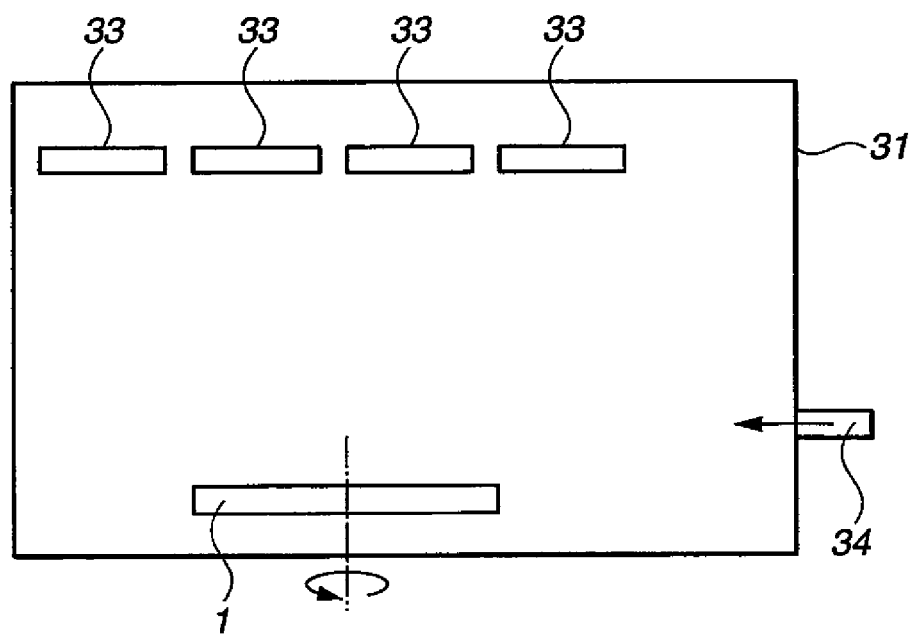
FIG. 15 schematically illustrates a sputtering system used in Example 8 and Comparative Example 5.

A dc sputtering system as shown in FIG. 15 was used comprising a cathode structure having four targets 33 and a drive mechanism for rotating a substrate 1 about its axis in a chamber 31. An inlet 34 is provided for feeding a sputtering gas into the chamber 31. The targets included two $MoSi_{3.66}$ targets (sputtering face area 38 cm$^2$) and two Si targets (sputtering face area 38 cm$^2$). The sputtering gas used was a mixture of Ar, $N_2$ and $N_2O$, which was fed as shown in Table 3. While rotating a square quartz substrate of 152 mm on each side and adjusting the input powers across the targets as shown in Table 3, a phase shift film consisting of two molybdenum silicide oxynitride layers having different compositional ratios of silicon to molybdenum was deposited on the substrate.

TABLE 3

| | Sputtering gas (flow rate, sccm) | | | | Target No. | | | |
|---|---|---|---|---|---|---|---|---|
| | | | | | 1 | 2 | 3 | 4 |
| | | | | | \multicolumn{4}{c}{Target composition} |
| | Ar | $N_2$ | $N_2O$ | | $MoSi_{3.66}$ | $MoSi_{3.66}$ | Si | Si |
| Upper layer (surface side) | 5 | 20 | 0.5 | Input power | 130 W | 52 W | 150 W | 250 W |
| Lower layer (substrate side) | 5 | 20 | 2.2 | Input power | 194 W | 70 W | 150 W | 250 W |

In a 142 mm×142 mm region of the phase shift film as deposited excluding a peripheral rim, a phase shift and a transmittance at the wavelength 193 nm were measured, finding a phase shift of 178.84±1.57 degrees and a transmittance of 5.65+0.09%. These data prove that the phase shift film has a phase shift distribution within ±2.0 degrees and a transmittance distribution within ±0.15%. The film was 690 Å thick. For measurement of phase difference and transmittance, a phase shift measurement system MPM-193 by Lasertec Corp. was used.

Figure 16:
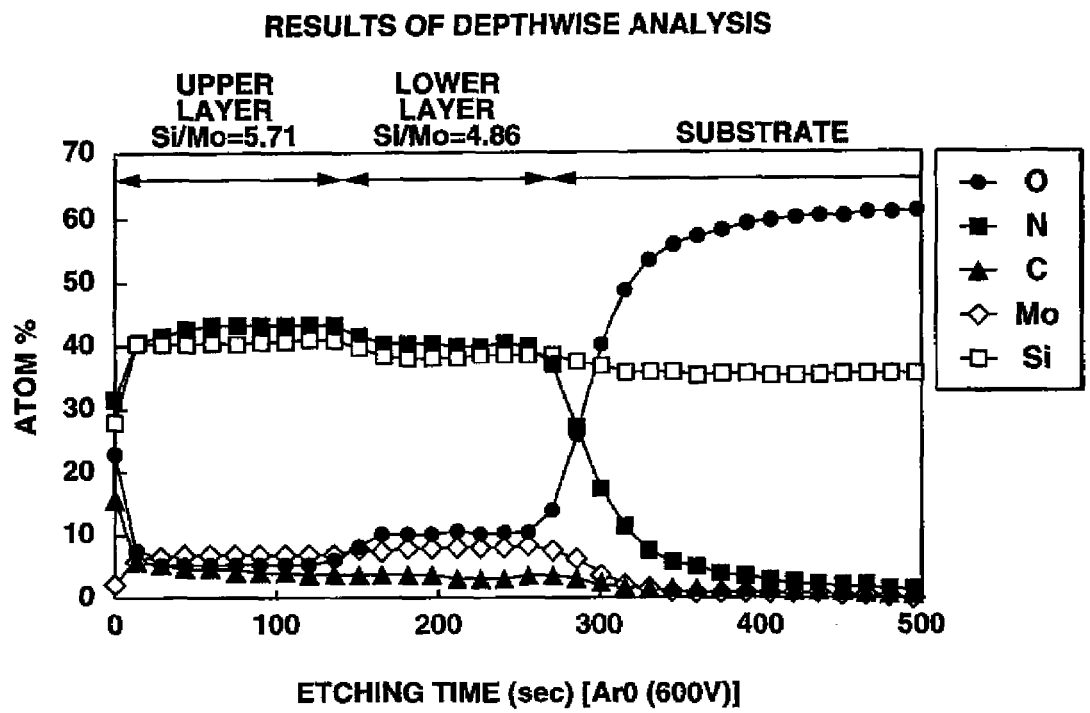
FIG. 16 is a diagram showing the composition in depth direction of a phase shift mask blank obtained in Example 8.

The composition of the phase shift film thus deposited was analyzed in a depth direction by XPS, with the results shown in FIG. 16. Since the input powers across the MoSi targets were changed between the upper layer (on the surface side) and the lower layer (on the substrate side), the compositional ratio of Si to Mo was 5.71 for the upper layer and 4.86 for the lower layer. It is evident that the compositional ratio of silicon to metal was different between the upper and lower layers.

From the phase shift mask blank fabricated above, a phase shift mask was manufactured by effecting reactive ion etching (RIE) according to the mask patterning procedure as shown in FIG. 8. A substantially perpendicular sidewall appeared at the interface between the phase shift film and the etched-away portion, indicating good perpendicularity in etched cross-sectional geometry.

Comparative Example 5

A dc sputtering system as shown in FIG. 15 was used comprising a cathode structure having four targets and a drive mechanism of rotating a substrate about its axis in a chamber. The targets included four $MoSi_9$ targets (sputtering face area 38 cm$^2$). As the sputtering gas, $N_2$, $N_2O$ and CO were fed at a flow rate of 40, 0.6 and 1.0 sccm, respectively. While rotating a square quartz substrate of 152 mm on each side and setting the input powers across the targets as shown in Table 4, a phase shift film in the form of a single molybdenum silicide oxide nitride carbide layer was deposited on the substrate.

TABLE 4

| | Target No. | | | |
|---|---|---|---|---|
| | 1 | 2 | 3 | 4 |
| Target composition | $MoSi_9$ | $MoSi_9$ | $MoSi_9$ | $MoSi_9$ |
| Input power | 220 W | 220 W | 150 W | 150 W |

In a 142 mm×142 mm region of the phase shift film as deposited excluding a peripheral rim, a phase shift and a transmittance at the wavelength 193 nm were measured, finding a phase shift of 179.23±1.26 degrees and a transmittance of 6.19±0.13%. The film was 790 Å thick.

Figure 17:
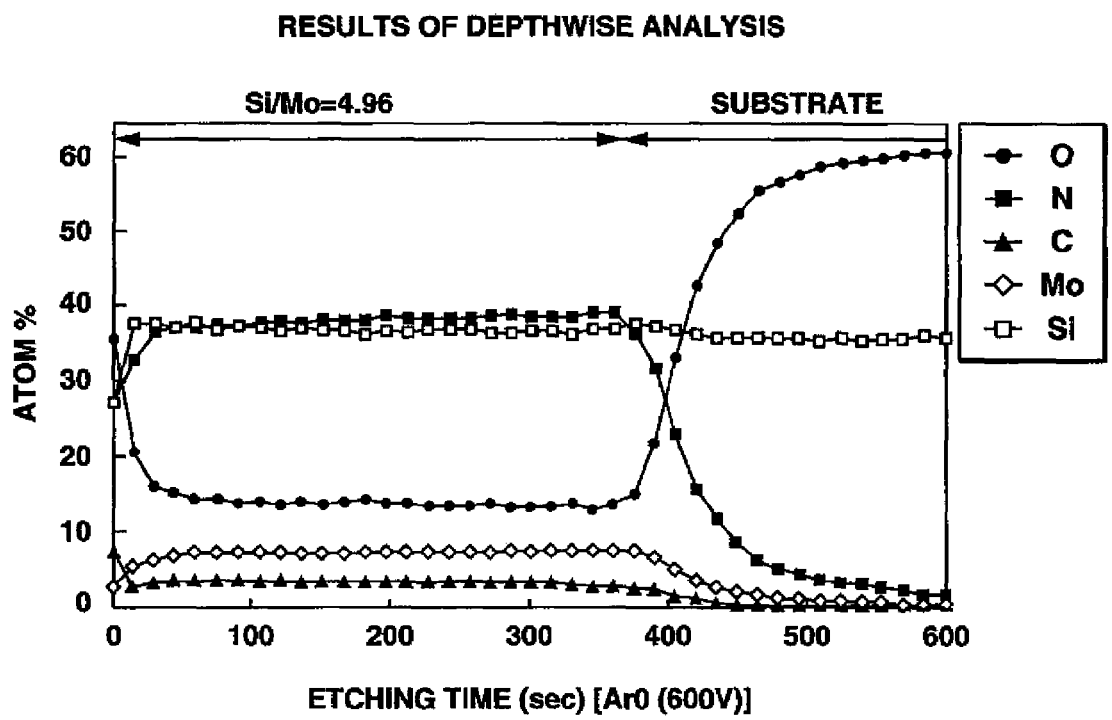
FIG. 17 is a diagram showing the composition in depth direction of a phase shift mask blank obtained in Comparative Example 5.

The composition of the phase shift film thus deposited was analyzed in a depth direction by XPS, with the results shown in FIG. 17. Since the single molybdenum silicide oxide nitride carbide layer was deposited using only molybdenum silicide targets, the compositional ratio of Si to Mo was kept constant.

From the phase shift mask blank fabricated above, a phase shift mask was manufactured by effecting reactive ion etching (RIE) according to the mask patterning procedure as shown in FIG. 8. A footing on the substrate side appeared at the interface between the phase shift film and the etched-away portion, indicating inferior perpendicularity in etched cross-sectional geometry to Example 8.

The invention claimed is:

1. A phase shift mask blank, comprising:
   a substrate which is transparent to exposure light; and
   a phase shift film disposed on the substrate, said phase shift film having one side contacting the substrate and a surface side remote therefrom, wherein
   said phase shift film consists of one of metal silicide oxide, metal silicide nitride and metal silicide oxynitride, and
   said phase shift film comprises a plurality of layers containing a metal and silicon in different compositional ratios which are stacked in such order that a layer having a higher etching rate is on the substrate side and a layer having a lower etching rate is on the surface side.

2. The phase shift mask blank of claim 1 wherein said metal is molybdenum.

3. The phase shift mask blank of claim 2 wherein in said phase shift film, the plurality of layers are stacked such that the compositional ratio of silicon to molybdenum increases from the substrate side to the surface side.

4. The phase shift mask blank of claim 1 wherein a phase difference distribution in a substrate plane at the wavelength of light used for exposure has a center value of 180±10 degrees, and a transmittance distribution in a substrate plane has a center value of 3 to 40%.

5. The phase shift mask blank of claim 4 wherein the phase difference distribution in a substrate plane at the wavelength of light used for exposure is within ±2.0 degrees relative to its center value, and the transmittance distribution in a substrate plane is within ±0.15% relative to its center value.

6. A method for manufacturing the phase shift mask blank of claim 1, comprising
using a sputtering system capable of simultaneously causing at least two targets to produce electric discharges, and
sputtering a combination of at least two metal silicide targets, or a combination of at least one metal silicide target with a metal target or a silicon target or both, thereby depositing layers on the substrate to form the phase shift film.

7. The method of claim 6 wherein the sputtering is reactive sputtering using a reactive gas, and
said phase shift film comprises one of metal silicide oxide, metal silicide nitride, metal silicide oxynitride, metal silicide oxycarbide, metal silicide nitride carbide and metal silicide oxide nitride carbide.

8. The method of claim 6 wherein said metal is molybdenum.

9. The method of claim 8 wherein in said phase shift film, the plurality of layers are stacked such that the compositional ratio of silicon to molybdenum increases from the substrate side to the surface side.

10. A phase shift mask fabricated by patterning the phase shift film of the phase shift mask blank of claim 1.

11. A method for manufacturing a phase shift mask, comprising
forming a resist film pattern on the phase shift film of the phase shift mask blank of claim 1 by lithography,
etching away those portions of the phase shift film which are not covered with the resist film, and
removing the resist film.

* * * * *